United States Patent
Takishita et al.

(10) Patent No.: US 10,401,726 B2
(45) Date of Patent: Sep. 3, 2019

(54) COLORING COMPOSITION, FILM, COLOR FILTER, PATTERN FORMING METHOD, METHOD OF MANUFACTURING COLOR FILTER, SOLID IMAGE PICKUP ELEMENT, AND INFRARED SENSOR

(71) Applicant: FUJIFILM Corporation, Tokyo (JP)

(72) Inventors: Hirotaka Takishita, Haibara-gun (JP); Tetsuya Kamimura, Haibara-gun (JP); Hirokazu Kyota, Haibara-gun (JP); Toshihide Ezoe, Haibara-gun (JP); Kazuto Shimada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/288,588

(22) Filed: Oct. 7, 2016

(65) Prior Publication Data

US 2017/0023858 A1 Jan. 26, 2017

Related U.S. Application Data

(63) Continuation of application No. PCT/JP2015/061815, filed on Apr. 17, 2015.

(30) Foreign Application Priority Data

May 27, 2014 (JP) .................................. 2014-109206

(51) Int. Cl.
*G03F 7/00* (2006.01)
*G02F 1/361* (2006.01)
(Continued)

(52) U.S. Cl.
CPC .............. *G03F 7/0007* (2013.01); *C08F 2/44* (2013.01); *C08F 2/48* (2013.01); *C08L 101/00* (2013.01);
(Continued)

(58) Field of Classification Search
CPC ........ G02F 1/361; G03F 7/0007; G03F 7/029; G03F 7/039; G03F 7/0045; G03F 7/20;
(Continued)

(56) References Cited

U.S. PATENT DOCUMENTS 8,318,053 B2 * 11/2012 Choi ..................... G03F 7/0007
252/582
2010/0243970 A1 * 9/2010 Toshimitsu ............ G02B 5/223
252/582

(Continued)

FOREIGN PATENT DOCUMENTS

JP 2009-69822 A 4/2009

OTHER PUBLICATIONS

International Search Report for PCT/JP2015/061815 (PCT/ISA/210) dated Jul. 7, 2015.
(Continued)

*Primary Examiner* — Bijan Ahvazi
(74) *Attorney, Agent, or Firm* — Birch, Stewart, Kolasch & Birch, LLP

(57) ABSTRACT

A coloring composition includes colorants, polymerizable compounds, and a resin, in which a ratio P/M of a mass P of the colorants to a mass M of the polymerizable compounds is 0.05 to 0.35, a content of the polymerizable compounds is 25 to 65 mass % with respect to a total solid content of the coloring composition, a ratio A/B of a minimum value A of an absorbance in a wavelength range of 400 nm or longer and shorter than 580 nm to a minimum value B of an absorbance in a wavelength range of 580 nm to 770 nm is 0.3 to 3, and a ratio C/D of a minimum value C of an absorbance in a wavelength range of 400 nm to 750 nm to a maximum value D of an absorbance in a wavelength range of 850 nm to 1300 nm is 5 or higher.

19 Claims, 1 Drawing Sheet

(51) Int. Cl.
| | |
|---|---|
| C08F 2/44 | (2006.01) |
| C08L 101/00 | (2006.01) |
| C09B 67/46 | (2006.01) |
| G02B 5/22 | (2006.01) |
| G03F 7/004 | (2006.01) |
| G03F 7/029 | (2006.01) |
| G03F 7/039 | (2006.01) |
| G03F 7/16 | (2006.01) |
| G03F 7/20 | (2006.01) |
| G03F 7/30 | (2006.01) |
| C08F 2/48 | (2006.01) |
| C09D 4/00 | (2006.01) |
| C09B 67/00 | (2006.01) |
| C09B 67/22 | (2006.01) |
| G03F 7/027 | (2006.01) |
| G03F 7/105 | (2006.01) |
| G02B 5/20 | (2006.01) |
| H01L 27/146 | (2006.01) |

(52) U.S. Cl.
CPC ........ *C09B 67/009* (2013.01); *C09B 67/0022* (2013.01); *C09B 67/0033* (2013.01); *C09B 67/0084* (2013.01); *C09D 4/00* (2013.01); *G02B 5/201* (2013.01); *G02B 5/223* (2013.01); *G03F 7/0045* (2013.01); *G03F 7/027* (2013.01); *G03F 7/029* (2013.01); *G03F 7/039* (2013.01); *G03F 7/105* (2013.01); *G03F 7/162* (2013.01); *G03F 7/20* (2013.01); *G03F 7/3021* (2013.01); *H01L 27/14621* (2013.01); *H01L 27/14625* (2013.01); *H01L 27/14649* (2013.01); *H01L 27/14685* (2013.01)

(58) Field of Classification Search
CPC ....... G03F 7/162; G03F 7/3021; G02B 5/223; C09B 67/0084
See application file for complete search history.

(56) References Cited

U.S. PATENT DOCUMENTS

2012/0182638 A1\* 7/2012 Takakuwa ........... C09B 67/0069
359/892
2012/0187351 A1\* 7/2012 Ito ........................... C08F 2/50
252/586

OTHER PUBLICATIONS

Written Opinion of the International Searching Authority for PCT/JP2015/061815 (PCT/ISA/237) dated Jul. 7, 2015.
English Translation of International Preliminary Report on Patentability (including PCT/IB/373 and PCT/ISA/237) for PCT/JP2015/061815, dated Nov. 29, 2016.

\* cited by examiner

COLORING COMPOSITION, FILM, COLOR FILTER, PATTERN FORMING METHOD, METHOD OF MANUFACTURING COLOR FILTER, SOLID IMAGE PICKUP ELEMENT, AND INFRARED SENSOR

CROSS-REFERENCE TO RELATED APPLICATIONS

This application is a Continuation of PCT International Application No. PCT/JP2015/61815, filed on Apr. 17, 2015, which claims priority under 35 U.S.C. § 119(a) to Japanese Patent Application No. 2014-109206, filed on May 27, 2014. Each of the above application(s) is hereby expressly incorporated by reference, in its entirety, into the present application.

BACKGROUND OF THE INVENTION

1. Field of the Invention

The present invention relates to a coloring composition. In particular, the present invention relates to a coloring composition which is preferably used for forming a color filter. Further, the present invention relates to a film, a color filter, a solid image pickup element, and an infrared sensor in which the coloring composition is used. In addition, the present invention relates to a pattern forming method and a method of manufacturing a color filter in which the coloring composition is used.

2. Description of the Related Art

A color filter is an essential component in a solid image pickup element or a liquid crystal display. In particular, in a color filter for a solid image pickup element, improvement of color separability and improvement of color reproducibility are required.

This color filter is formed to include colored regions of plural hues. For example, the color filter may be formed to include red, green, and blue colored regions (hereinafter, also referred to as "colored patterns" or "colored pixels"). A method of forming a colored pattern includes: applying a coloring composition having any one of red, green, and blue colorants to obtain a colored pattern of a first hue; forming a colored pattern by performing exposure, development, and optionally a heat treatment on the applied coloring composition; and repeating application, exposure, development, and optionally a heat treatment as described above to obtain colored patterns of a second hue and a third hue.

JP2009-69822A discloses a resin black matrix in which a maximum light transmittance in a wavelength range of 400 to 700 nm is 1% or lower, and an average light transmittance in a wavelength range of 850 to 3000 nm is 60% or higher.

SUMMARY OF THE INVENTION

A sensing technique using near infrared rays is used for various purposes.

Near infrared rays are less likely to be scattered than visible rays due to their longer wavelength and can be used in, for example, distance measurement or three-dimensional measurement. By utilizing these characteristics of near infrared rays, near infrared rays can be used in a proximity sensor, a motion sensor, or the like. In addition, near infrared rays are invisible to persons or animals. Therefore, even when an object is irradiated using a near infrared light source at night, the object cannot recognize near infrared rays. Thus, near infrared rays can be used for imaging a nocturnal wild animal or imaging an object without provoking the object for security reasons.

The development of a color filter capable of allowing transmission of near infrared rays in a state where noise generated from visible rays is small is desired.

However, according to investigation by the present inventors, it was found that the surface of a film is likely to be corrugated in a case where the film is formed by applying a coloring composition in a film shape and then curing the coloring composition to form a film, the coloring composition being able to form a film capable of allowing transmission of near infrared rays in a state where noise generated from visible rays is small. In addition, it was found that, as the thickness of the film increases, the surface of the film is more likely to be corrugated.

Accordingly, an object of the present invention is to provide a coloring composition with which a film capable of allowing transmission of near infrared rays and suppressing corrugation in a state where noise generated from visible rays is small can be formed. In addition, another object of the present invention is to provide a film, a color filter, a pattern forming method, a method of manufacturing a color filter, a solid image pickup element, and an infrared sensor in which the coloring composition is used.

The present inventors performed a thorough investigation and found that, by adjusting the content of polymerizable compounds in a coloring composition to be in a predetermined range described below and adjusting a ratio of the mass of colorants to the mass of the polymerizable compounds in the coloring composition to be in a predetermined range described below, the inside of a film formed using the coloring composition is uniformly cured, corrugation is not likely to occur, and the above-described object can be achieved, thereby completing the present invention. That is, the present invention is as follows.

<1> A coloring composition comprising: colorants; polymerizable compounds; and a resin, in which a ratio P/M of a mass P of the colorants to a mass M of the polymerizable compounds is 0.05 to 0.35, a content of the polymerizable compounds is 25 to 65 mass % with respect to a total solid content of the coloring composition, a ratio A/B of a minimum value A of an absorbance in a wavelength range of 400 nm or longer and shorter than 580 nm to a minimum value B of an absorbance in a wavelength range of 580 nm to 770 nm is 0.3 to 3, and a ratio C/D of a minimum value C of an absorbance in a wavelength range of 400 nm to 750 nm to a maximum value D of an absorbance in a wavelength range of 850 nm to 1300 nm is 5 or higher.

<2> The coloring composition according to <1>, in which a ratio M/B of the mass M of the polymerizable compounds to a mass B of the resin is 0.4 to 3.0.

<3> A coloring composition comprising: colorants; and polymerizable compounds, in which a ratio P/M of a mass P of the colorants to a mass M of the polymerizable compounds is 0.05 to 0.35, a content of the polymerizable compounds is 25 to 65 mass % with respect to a total solid content of the coloring composition, the colorants include at least a yellow colorant and a blue colorant, a ratio (yellow colorant/all the colorants) of the mass of the yellow colorant to the total mass of the colorants is 0.1 to 0.5, and a ratio (blue colorant/all the colorants) of the mass of the blue colorant to the total mass of the colorants is 0.1 to 0.6.

<4> The coloring composition according to <3>, in which the colorants further include a red colorant and a violet colorant, a ratio (red colorant/all the colorants) of the mass of the red colorant to the total mass of the colorants is 0.1 to 0.5, a ratio (yellow colorant/all the colorants) of the mass of the yellow colorant to the total mass of the colorants is 0.1 to 0.4, a ratio (blue colorant/all the colorants) of the mass of the blue colorant to the total mass of the colorants is 0.2 to 0.6, and a ratio (violet colorant/all the colorants) of the mass of the violet colorant to the total mass of the colorants is 0.01 to 0.3.

<5> The coloring composition according to any one of <1> to <4>, in which the colorants include a blue pigment, a red pigment, a yellow pigment, and a violet pigment.

<6> The coloring composition according to any one of <1> to <5>, in which the polymerizable compounds include a polymerizable compound which has an alkyleneoxy chain including two or more alkyleneoxy groups as a repeating unit.

<7> The coloring composition according to any one of <1> to <6>, in which a value obtained by dividing a value of a molecular weight of each of the polymerizable compounds by the number of polymerizable groups in the polymerizable compound is 100 to 300.

<8> The coloring composition according to any one of <1> to <7>, in which when a film having a thickness of 12.0 μm after drying is formed, a maximum value of a transmittance in a wavelength range of 400 to 780 nm is 15% or lower and a transmittance at a wavelength of 850 nm is 80% or higher.

<9> The coloring composition according to any one of <1> to <8>, in which a viscosity at 25° C. is 100 to 150 mP·s.

<10> A film which is formed by curing the coloring composition according to any one of <1> to <9>.

<11> A color filter comprising: the film according to <10>.

<12> A pattern forming method comprising: a step of applying the coloring composition according to any one of <1> to <9> to a support to form a coloring composition layer; a step of exposing the coloring composition layer in a pattern shape; and a step of forming a colored pattern by removing a non-exposed portion by development.

<13> A method of manufacturing a color filter comprising the pattern forming method according to <12>.

<14> A solid image pickup element comprising the color filter according to <11> or a color filter which is obtained using the method of manufacturing a color filter according to <13>.

<15> An infrared sensor comprising the color filter according to <11> or a color filter which is obtained using the method of manufacturing a color filter according to <13>.

According to the present invention, a coloring composition can be provided with which a film capable of allowing transmission of near infrared rays and suppressing corrugation in a state where noise generated from visible rays is small can be formed. In addition, a film, a color filter, a pattern forming method, a method of manufacturing a color filter, a solid image pickup element, and an infrared sensor in which the coloring composition is used can be provided.

DESCRIPTION OF THE PREFERRED EMBODIMENTS

Figure 1:
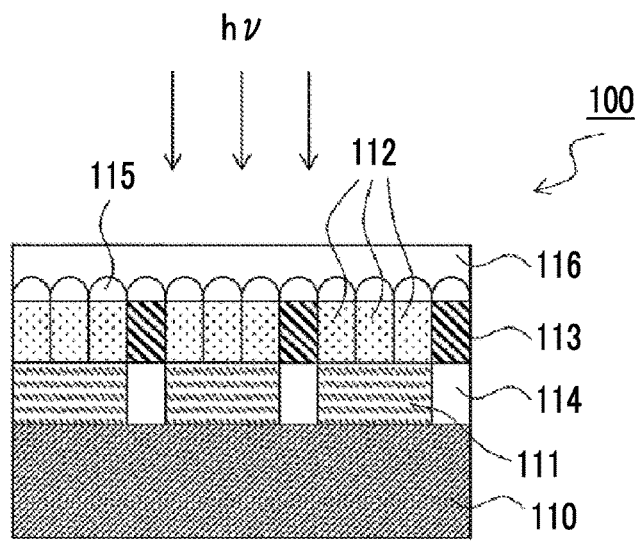
FIG. 1 is a schematic cross-sectional view showing a configuration of an infrared sensor according to an embodiment of the present invention.

In this specification, a total solid content denotes the total mass of components of a total composition of a coloring composition excluding a solvent. In addition, a solid content denotes a solid content at 25° C. In this specification, a viscosity denotes a viscosity at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "radiation" denotes, for example, a bright light spectrum of a mercury lamp, a far ultraviolet ray represented by excimer laser, an extreme ultraviolet ray (EUV ray), an X-ray, or an electron ray.

In this specification, "light" denotes an actinic ray or radiation.

In this specification, unless specified otherwise, "exposure" refers to not only exposure using a mercury lamp, far ultraviolet rays represented by excimer laser, X-rays, or EUV rays but also drawing using corpuscular beams such as electron rays or ion beams.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, "monomer" is distinguished from "oligomer" and "polymer" and denotes a compound having a weight average molecular weight of 2000 or lower.

In this specification, a polymerizable compound denotes a compound having a polymerizable functional group and may be either a monomer or a polymer. A polymerizable functional group denotes a group relating to a polymerization reaction.

In this specification, in a chemical formula, Me represents a methyl group, Et represents an ethyl group, Pr represents a propyl group, Bu represents a butyl group, and Ph represents a phenyl group.

In this specification, the term "step" denotes not only an individual step but also a step which is not clearly distinguishable from another step as long as an effect expected from the step can be achieved.

In this specification, a weight average molecular weight and a number average molecular weight are defined as values in terms of polystyrene obtained by gel permeation chromatography (GPC). In this specification, an weight average molecular weight (Mw) and a number average molecular weight (Mn) can be obtained by using HLC-8220 (manufactured by Tosoh Corporation), using TSKgel Super AWM-H (manufactured by Tosoh Corporation; 6.0 mm ID×15.0 cm) as a column, and using a 10 mmol/L lithium bromide N-methylpyrrolidinone (NMP) solution as an eluent.

"Pigment" denotes an insoluble colorant compound which is not likely to dissolve in a solvent. Typically, "pigment" denotes a colorant compound which is present in a state of being dispersed as particles in a composition. As the solvent described herein, for example, an arbitrary solvent can be used, and examples thereof include water and solvents described in the item "Organic Solvent" below. It is preferable that the pigment has a solubility of 0.1 g/100 g Solvent or lower at 25° C., for example, both in propylene glycol monomethyl ether acetate and in water.

<Coloring Composition>

According to a first aspect of the present invention, there is provided a coloring composition including colorants and polymerizable compounds, in which a ratio P/M of a mass P of the colorants to a mass M of the polymerizable compounds is 0.05 to 0.35, a content of the polymerizable compounds is 25 to 65 mass % with respect to a total solid content of the coloring composition, a ratio A/B of a minimum value A of an absorbance in a wavelength range of 400 nm or longer and shorter than 580 nm to a minimum value B of an absorbance in a wavelength range of 580 nm to 770 nm is 0.3 to 3, and a ratio C/D of a minimum value C of an absorbance in a wavelength range of 400 nm to 750 nm to a maximum value D of an absorbance in a wavelength range of 850 nm to 1300 nm is 5 or higher.

The above-described absorbance ratio A/B is preferably 0.4 to 2.5 and more preferably 0.5 to 2. In addition, the above-described absorbance ratio C/D is preferably 10 or higher and more preferably 50 or higher. By adjusting the absorbance ratios of the coloring composition A/B and C/D to be in the above-described ranges, respectively, a film capable of allowing transmission of near infrared rays in a state where noise generated from visible rays is small is likely to be formed.

Means for achieving the above-described absorbance is not particularly limited. For example, in a preferable embodiment, the above-described absorbance can be achieved by adjusting the kind of each of the colorants and the content thereof. In addition, as another means for achieving the above-described absorbance, for example, materials from which light having a specific wavelength is reflected are used in combination.

An absorbance AX at a wavelength λ is defined by the following Expression (1).

$$A\lambda = -\log(T\lambda) \quad (1)$$

Aλ denotes the absorbance at the wavelength λ, and Tλ denotes a transmittance at the wavelength λ.

A value of the absorbance of the coloring composition may be a value measured in the form of a solution or a value of a film which is formed using the coloring composition. In a case where the absorbance is measured in the form of the film, it is preferable that the film is formed by applying the coloring composition to a glass substrate using a method such as spin coating such that the thickness of the dried film is a predetermined value, and drying the applied coloring composition on a hot plate at 100° C. for 120 seconds.

The thickness of the film can be obtained by measuring the thickness of the substrate including the film using a stylus surface profilometer (DEKTAK 150, manufactured by ULVAC Inc.).

The absorbance can be measured using a well-known spectrophotometer of the related art. Measurement conditions of the absorbance are not particularly limited. For example, it is preferable that the absorbance is measured under conditions adjusted such that the minimum value A of the absorbance in a wavelength range of 400 nm or longer and shorter than 580 nm is 0.1 to 3.0. By measuring the absorbance under the above-described conditions, a measurement error can be further reduced. A method of adjusting the minimum value A of the absorbance in a wavelength range of 400 nm or longer and shorter than 580 nm to be 0.1 to 3.0 is not particularly limited. For example, in a case where the absorbance is measured in the form of a liquid, for example, a method of adjusting the optical path length of a sample cell can be used. In addition, in a case where the absorbance is measured in the form of the film, for example, a method of adjusting the thickness of the film can be used.

According to a second aspect of the present invention, there is provided a coloring composition including colorants and polymerizable compounds, in which a ratio P/M of a mass P of the colorants to a mass M of the polymerizable compounds is 0.05 to 0.35, a content of the polymerizable compounds is 25 to 65 mass % with respect to a total solid content of the coloring composition, the colorants include at least a yellow colorant and a blue colorant, a ratio (yellow colorant/all the colorants) of the mass of the yellow colorant to the total mass of the colorants is 0.1 to 0.5, and a ratio (blue colorant/all the colorants) of the mass of the blue colorant to the total mass of the colorants is 0.1 to 0.6.

In this aspect, it is preferable that the colorants further include a red colorant and a violet colorant, a ratio (red colorant/all the colorants) of the mass of the red colorant to the total mass of the colorants is 0.1 to 0.5 (preferably 0.1 to 0.4), a ratio (yellow colorant/all the colorants) of the mass of the yellow colorant to the total mass of the colorants is 0.1 to 0.4, a ratio (blue colorant/all the colorants) of the mass of the blue colorant to the total mass of the colorants is 0.2 to 0.6, and a ratio (violet colorant/all the colorants) of the mass of the violet colorant to the total mass of the colorants is 0.01 to 0.3.

By adjusting the ratios of the mass of the yellow colorant and the mass of the blue colorant to the total mass of the all the colorants to be in the above-described respective ranges and preferably by adjusting the ratios of the mass of the yellow colorant, the mass of the blue colorant, the mass of the red colorant, and the mass of the violet colorant to the total mass of all the colorants to be in the above-described respective ranges, a film capable of allowing transmission of near infrared rays in a state noise generated from visible rays is small is easily formed.

By using the coloring composition according to the first aspect in which the absorbance ratio A/B is 0.3 to 3 and the absorbance ratio C/D is 5 or higher or the coloring composition according to the second aspect containing the yellow colorant and the blue colorant in the above-described ranges, a film capable of allowing transmission of near infrared rays in a state noise generated from visible rays is small can be formed.

In addition, in the coloring composition according to the present invention, the ratio P/M of the mass P of the colorants to the mass M of the polymerizable compounds is 0.05 to 0.35, and the content of the polymerizable compounds is 25 to 65 mass % with respect to a total solid content of the coloring composition. As a result, a film in which corrugation is suppressed can be formed. The reason why these effects are obtained is thought to be as follows.

That is, the coloring composition, with which a film capable of allowing near infrared rays in a state where noise generated from visible rays is small can be formed, has low transmittance with respect to i-rays or the like. Therefore, the curing properties of the inside of the film are likely to be lower than those of a surface of the film. Therefore, since the surface of the film is likely to be cured before the inside of the film is cured, the surface of the film is likely to be corrugated due to shrinkage caused by the curing of the polymerizable compounds. The reason for this is thought to be as follows. By adjusting the ratio P/M of the mass P of the colorants to the mass M of the polymerizable compounds to be 0.05 to 0.35 and adjusting the content of the polymerizable compounds to be 25 to 65 mass % with respect to a total solid content of the coloring composition, in a case where the coloring composition is applied in a film shape, the curing properties of the surface of the film can be made to be the same as those of the inside of the film. A film in which corrugation is suppressed can be formed. In particular, the coloring composition is useful for forming a film having a thickness of 1.0 μm or more or 6.0 μm.

Hereinafter, each of components of the coloring composition according to the present invention will be described.

<<Colorant>>

The coloring composition according to the present invention includes colorants.

As the colorant, a pigment or a dye may be used. A pigment is preferable because it has high resistance to heat or light. In addition, the content of the pigment in the colorants is preferably 95 mass % or higher, more preferably 97 mass % or higher, and still more preferably 99 mass % or higher with respect to the total mass of the colorants.

The pigment is preferably an organic pigment, and examples thereof are as follows. However, the present invention is not limited to the examples:

C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, and 58 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

C.I. Pigment Black 1 (which is a black pigment);

Among these organic pigments, one kind may be used alone, or two or more kinds may be used in combination.

As an inorganic pigment, for example, a metal compound such as a metal oxide or a metal complex salt can be used, and specific examples thereof include: a black pigment such as carbon black (for example, C.I. Pigment Black 7) or titanium black; an oxide of a metal such as iron, cobalt, aluminum, cadmium, lead, copper, titanium, magnesium, chromium, zinc, or antimony; and a composite oxide of the metal.

As the dye, a well-known dye which is used for a color filter can be used without any particular limitation.

In terms of a chemical structure, a dye such as a pyrazole azo dye, an anilino azo dye, a triphenylmethane dye, an anthrapyridone dye, an anthraquinone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used.

In addition, as the dye, an acid dye and/or a derivative thereof may be suitably used.

Furthermore, for example, a direct dye, a basic dye, a mordant dye, an acid mordant dye, an azoic dye, a disperse dye, an oil-soluble dye, a food dye, and/or a derivative thereof can be suitably used.

Specific examples of the acid dye are shown below, but the present invention is not limited to these examples.

acid alizarin violet N;

acid black 1, 2, 24, 48;

acid blue 1, 7, 9, 15, 18, 23, 25, 27, 29, 40-45, 62, 70, 74, 80, 83, 86, 87, 90, 92, 103, 112, 113, 120, 129, 138, 147, 158, 171, 182, 192, 243, and 324:1;

acid chrome violet K;

acid Fuchsin and acid green 1, 3, 5, 9, 16, 25, 27, and 50;

acid orange 6, 7, 8, 10, 12, 50, 51, 52, 56, 63, 74, and 95;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;

acid violet 6B, 7, 9, 17, and 19;

acid yellow 1, 3, 7, 9, 11, 17, 23, 25, 29, 34, 36, 42, 54, 72, 73, 76, 79, 98, 99, 111, 112, 114, 116, 184, and 243; and Food Yellow 3.

Derivatives of the acid dye are also preferably used. In addition to the above-described examples, an azo acid dye, a xanthene acid dye, and a phthalocyanine acid dye are preferably used, and the following acid dyes, C.I. Solvent Blue 44 and 38, C.I. Solvent Orange 45, Rhodamine B, and Rhodamine 110 and derivatives of the dyes are preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

In addition, a bisbenzofuranone pigment, an azomethine pigment, a perylene pigment, or an azo dye can also be used.

Examples of the bisbenzofuranone pigment include pigments described in JP2012-528448A, JP2010-534726A, and JP2012-515234A. For example, "IRGAPHOR BK" (manufactured by BASF SE) is available.

Examples of the azomethine pigment include pigments described in JP1989-170601A (JP-H01-170601A) and JP1990-34664A (JP-H02-34664A). For example, "Chromofine Black A1103" (manufactured by Dainichiseika Color & Chemicals Mfg. Co.; Ltd.) is available.

The azo dye is not particularly limited, and for example, a compound represented by the following Formula (A-1) can be suitably used.

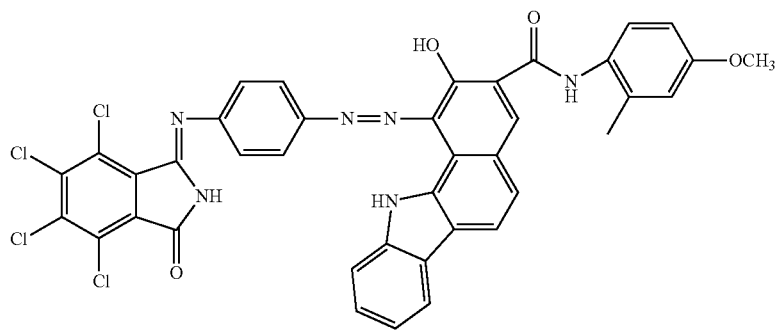
Chromofine Black A1103

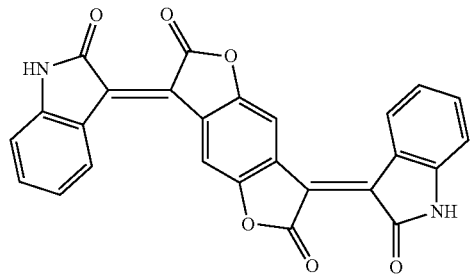
IRGAPHOR BK

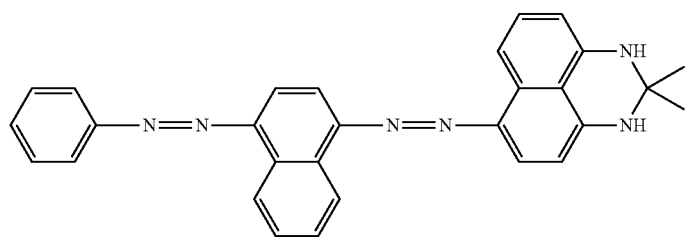
A-1

In a preferable embodiment, it is preferable that the colorants include at least a yellow colorant and a blue colorant, and it is more preferable that the colorants include a red colorant, a yellow colorant, a blue colorant, and a violet colorant. In addition, it is preferable that the colorants include a pigment, it is more preferable that the colorants include a yellow pigment and a blue pigment, and it is still more preferable that the colorants include a red pigment, a yellow pigment, a blue pigment, and a violet pigment. According to the aspect, a coloring composition can be obtained with which a film capable of allowing transmission of near infrared rays in a state where noise generated from visible rays is small can be formed.

As the red pigment, for example, CJ. Pigment Red 254 is preferable. As the yellow pigment, for example, C.I. Pigment Yellow 139 is preferable. As the blue pigment, for example, C.I. Pigment Blue 15:6 is preferable. As the violet pigment, for example, C.I. Pigment Violet 23 is preferable.

In addition, in another preferable embodiment of the colorants, it is preferable that the colorants include at least one colorant selected from the group consisting of a bisbenzofuranone pigment, an azomethine pigment, a perylene pigment, and an azo dye, and it is more preferable that the colorants include one or more colorants selected from the group consisting of a bisbenzofuranone pigment, an azomethine pigment, and a perylene pigment.

In addition, in a case where a red colorant, a yellow colorant, a blue colorant, and a violet colorant are used in combination, it is preferable that a ratio of the mass of the red colorant to the total mass of the colorants is preferably 0.1 to 0.5 (more preferably 0.1 to 0.4), a ratio of the mass of the yellow colorant to the total mass of the colorants is 0.1 to 0.4, a ratio of the mass of the blue colorant to the total mass of the colorants is 0.2 to 0.6, and a ratio of the mass of the violet colorant to the total mass of the colorants is 0.01 to 0.3. It is more preferable that a ratio of the mass of the red colorant to the total mass of the colorants is 0.3 to 0.5, a ratio of the mass of the yellow colorant to the total mass of the colorants is 0.1 to 0.3, a ratio of the mass of the blue colorant to the total mass of the colorants is 0.3 to 0.5, and a ratio of the mass of the violet colorant to the total mass of the colorants is 0.01 to 0.2.

According to each of the aspects, a coloring composition can be obtained in which a ratio A/B of a minimum value A of an absorbance in a wavelength range of 400 nm or longer and shorter than 580 nm to a minimum value B of an absorbance in a wavelength range of 580 nm to 770 nm is 0.3 to 3, and a ratio C/D of a minimum value C of an absorbance in a wavelength range of 400 nm to 750 nm to a maximum value D of an absorbance in a wavelength range of 850 nm to 1300 nm is 5 or higher.

The content of the colorants in the coloring composition according to the present invention is preferably 1 to 60 mass %, more preferably 3 to 50 mass %, and still more preferably 3 to 20 mass % with respect to the total solid content of the coloring composition.

<<Pigment Dispersion>>

In a case where a pigment is used as the colorant in the coloring composition according to the present invention, it is preferable that the pigment is used in the form of a pigment dispersion in which the pigment is dispersed together with a resin, an organic solvent, an pigment derivative, and the like. Hereinafter, the composition of the pigment dispersion and a method of preparing the pigment dispersion will be described in detail.

<<<<Pigment>>>>

The average particle size of the pigment is preferably 20 to 300 nm, more preferably 25 to 250 nm, and still more preferably 30 to 200 nm. "Average particle size" described herein denotes the average particle size of secondary particles which are aggregates of primary particles (single crystals) of the pigment. The average particle size of the pigment can be obtained by observing a pigment with a scanning electron microscope (SEM) or a transmission electron microscope (TEM), measuring particle sizes of 100 particles in a region where particles do not aggregate, and obtaining an average value of the measured particle sizes.

In addition, regarding a particle size distribution of the secondary particles of the pigment (hereinafter, referred to simply as "particle size distribution"), it is preferable that secondary particles having a particle size of (average particle size±100) nm account for 70 mass % or higher, more preferably, 80 mass % or higher in the pigment. The particle size distribution is measured using a scattering intensity distribution.

The pigment having an average particle size and a particle size distribution in the above-described ranges can be prepared by mixing a commercially available pigment with, preferably, a resin and an organic solvent to obtain a mixture and mixing and dispersing the mixture while pulverizing the mixture using a pulverizer such as a beads mill or a roll mill. The pigment obtained as described above is typically in the form of a pigment dispersion.

—Refinement of Pigment—

In the present invention, a pigment having fine granulated particles is preferably used. The pigment can be refined through the following steps of: preparing a high-viscosity liquid composition using the pigment, an organic solvent, and a water-soluble inorganic salt; and pulverizing the liquid composition under stress using, for example, a wet pulverizer.

As the organic solvent used in the refinement process of the pigment, a water-soluble organic solvent is preferable. Examples of the water-soluble organic solvent include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, and propylene glycol monomethyl ether acetate.

The amount of the water-soluble organic solvent used in the refinement process is 50 to 300 parts by mass and more preferably 100 to 200 parts by mass with respect to 100 parts by mass of the pigments.

In addition, another solvent having a low water solubility or no water solubility may be used in an amount where it does not wash away in waste water. Examples of the other solvent include benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, halogenated hydrocarbon, acetone, methyl ethyl ketone, methyl isobutyl ketone, cyclohexanone, dimethyl formamide, dimethyl sulfoxide, and N-methyl pyrrolidone.

Among these organic solvents used in the refinement process of the pigment, one kind may be used, or optionally, a mixture of two or more kinds may be used.

Examples of the water-soluble inorganic salt used in the refinement process of the pigment include sodium chloride, potassium chloride, calcium chloride, barium chloride, and sodium chloride.

The amount of the water-soluble inorganic salt used in the refinement process is 1 to 50 parts by mass and more preferably 1 to 10 parts by mass with respect to 1 part by mass of the pigment. In addition, a water-soluble inorganic salt having a water content of 1% or lower is preferably used.

Operating conditions of the wet pulverizer in the refinement process of the pigment are not particularly limited. In order to effectively promote the pulverization using a pulverization medium, in a case where the pulverizer is a kneader, it is preferable that operating conditions are as follows: the rotating speed of a blade in the kneader is preferably 10 to 200 rpm, and a speed ratio between two shafts is relatively high. Under these conditions, the pulverization effect is high. The operating time including a dry pulverization time is preferably 1 to 8 hours, and the internal temperature of the kneader is preferably 50° C. to 150° C. In addition, it is preferable that the water-soluble inorganic salt as a pulverization medium has a particle size of 5 to 50 μm, has a sharp particle size distribution, and is spherical.

<<<Resin (Dispersion Resin)>>>>

Examples of the resin (dispersion resin) used for preparing the pigment dispersion include: a polymeric dispersant such as a resin having an amine group (polyamideamine or a salt thereof), an oligoimine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate; and a surfactant such as a polyoxyethylene alkyl phosphoric acid ester, polyoxyethylene alkyl amine, or alkanol amine.

In terms of a structure, the polymeric dispersant can be further classified into a linear polymer, a terminal-modified polymer, a graft polymer, and a block polymer.

Examples of the terminal-modified polymer having an anchor site to a pigment surface include a polymer having a phosphate group at a terminal thereof described in JP1991-112992A (JP-H03-112992A) or JP2003-533455A, a polymer having a sulfonate group at a terminal thereof described in JP2002-273191A, and a polymer having a partial skeleton or a heterocycle of an organic colorant described in JP1997-77994A (JP-H09-77994A). In addition, polymers described in JP2007-277514A in which two or more anchor sites (for example, an acid group, a basic group, a partial skeleton or a hetero ring of an organic colorant) to a pigment surface are introduced into a terminal thereof are also preferable due to its dispersion stability.

Examples of the graft polymer having an anchor site to a pigment surface include a reaction product of poly(lowalkylene imine) and polyester described in JP1979-37082A (JP-S54-37082A), JP1996-507960A (JP-H08-507960A), or JP2009-258668A, a reaction product of polyallylamine and polyester described in JP1997-169821A (JP-H09-169821A), a copolymer of a macromonomer and a nitrogen-containing monomer described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer having an anchor site to the pigment surface by radical polymerization, a well-known macromonomer can be used. Examples of the well-known macromonomers include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H02-272009A). Among these, from the viewpoint of the developability and dispersion stability of the pigment and the developability of the coloring composition in which the pigment dispersion is used, a polyester macromonomer having excellent flexibility and solvent compatibility is more preferable, and the polyester macromonomer represented by the polyester macromonomer described in JP1990-272009A (JP-H02-272009A) is most preferable.

As the block polymer having an anchor site to a pigment surface, a block polymer described in JP2003-49110A or JP2009-52010A is preferable.

As the resin, a graft copolymerization including a structural unit represented by any one of the following Formulae (1) to (4) can also be used.

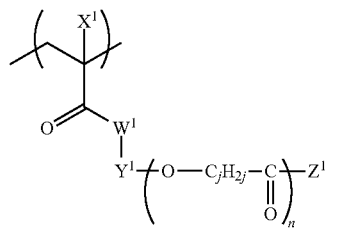
(1)

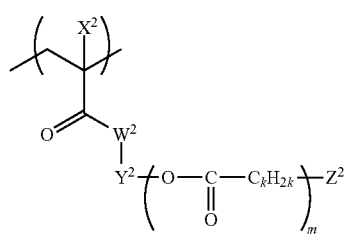
(2)

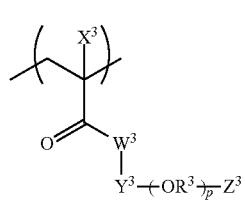
(3)

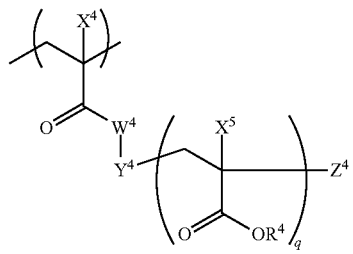
(4)

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group.

$W^1$, $W^2$, $W^3$, and $W^4$ each independently represent an oxygen atom or NH and preferably an oxygen atom.

$R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—$CH(CH_3)$— or a group represented by —$CH(CH_3)$—$CH_2$—.

$Y^1$, $Y^2$, $Y^3$, and $Y^4$ each independently represent a divalent linking group, and a structure thereof is not particularly limited.

The graft copolymer can be found in the description of paragraphs "0025" to "0069 of JP2012-255128A, the content of which is incorporated herein by reference.

Specific examples of the graft copolymer are as follows. In addition, a resin described in paragraphs "0072" to "0094" of JP2012-255128A can be used.

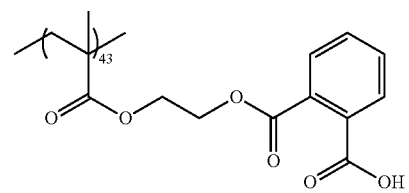

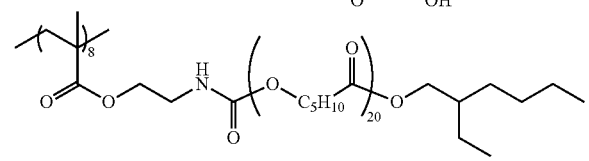

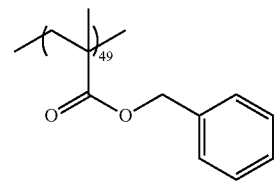

In addition, as the resin, an oligoimine resin having a nitrogen atom at least either a main chain or a side chain can be used. As the oligoimine resin, a resin, which includes a repeating unit having a partial structure X with a functional group (pKa: 14 or lower) and a side chain including a side chain Y having 40 to 10000 atoms and has a basic nitrogen atom at least either a main chain or a side chain, is preferable. The basic nitrogen atom is not particularly limited as long as it is a nitrogen atom exhibiting basicity.

Examples of the oligoimine resin include a resin including a repeating unit represented by the following Formula (I-1), a repeating unit represented by the following Formula (I-2), and/or a repeating unit represented by the following Formula (I-2a).

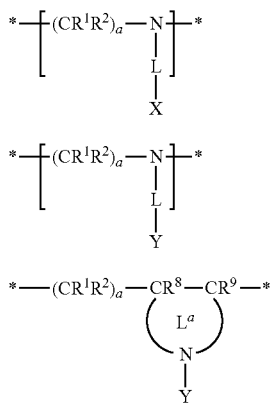

$R^1$ and $R^2$ each independently represent a hydrogen atom, a halogen atom, or an alkyl group (having preferably 1 to 6 carbon atoms). a's each independently represent an integer of 1 to 5. * represents a linking portion between repeating units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The resin (oligoimine resin) may further include one or more copolymerization components selected from the group consisting of the repeating units represented by Formulae (1-3), (I-4), and (I-5). By the resin containing the above-described repeating units, the dispersion performance of the pigment can be further improved.

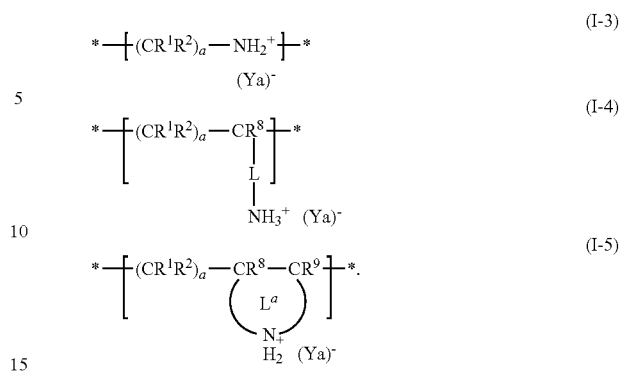

$R^1$, $R^2$, $R^8$, $R^9$, L, La, a, and * have the same definitions as those in Formulae (I-1), (I-2), and (1-2a).

Ya represents a side chain having 40 to 10000 atoms which has an anionic group. The repeating unit represented by Formula (1-3) can be formed by adding an oligomer or a polymer having a group, which reacts with amine to form a salt, to a resin having a primary or secondary amino group at a main chain such that they react with each other.

The oligoimine resin can be found in the description of paragraphs "0102" to "0166" of JP2012-255128A, the content of which is incorporated herein by reference. Specific examples of the oligoimine resin are as follows. In addition, a resin described in paragraphs "0168" to "0174" of JP2012-255128A can be used.

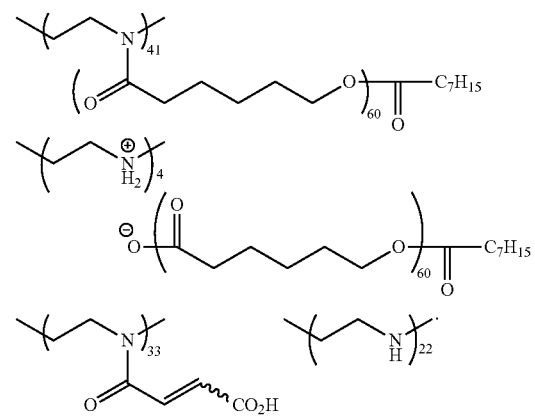

The resin is available as a commercially available product, and specific examples thereof include: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4010 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; "HINOACT T-8000E manufactured by Kawaken Fine Chemicals Co., Ltd"; "organosiloxane polymer KP341 manufactured by Shin-Etsu Chemical Co., Ltd."; "W001: cationic surfactant" manufactured by Yusho Co., Ltd.; nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters; anionic surfactants such as "W004, W005, and W017" all of which are manufactured by Yusho Co., Ltd.; polymeric dispersants such as "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "ISONET S-20" manufactured by Sanyo Chemical Industries Ltd.

Among these resins, one kind may be used alone, or two or more kinds may be used in combination. In addition, regarding the resin, the terminal-modified polymer, the graft polymer, or the block polymer having an anchor site to a pigment surface may be used in combination with an alkali-soluble resin described below. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H07-319161A) is also preferable.

The content of the resin (dispersion resin) in the pigment dispersion is preferably 1 to 100 parts by mass with respect to 100 parts by mass of the pigment. The upper limit is preferably 80 parts by mass or less, more preferably 70 parts by mass or less, and still more preferably 60 parts by mass or less. The lower limit is preferably 5 parts by mass or more and more preferably 10 parts by mass or more.

Here, the amount of the pigments denotes the total amount of the pigments included in the colorants.

<<<<Pigment Derivative>>>>

It is preferable that the pigment dispersion includes a pigment derivative.

The pigment derivative denotes a compound having a structure in which a portion of a pigment is substituted with an acidic group, a basic group, a phthalimidomethyl group, or the like. As the pigment derivative, a pigment derivative having an acidic group or a basic group is preferable from the viewpoints of dispersibility and dispersion stability.

Examples of a pigment for forming the pigment derivative include a diketo pyrrolopyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

As the acidic group included in the pigment derivative, a sulfonate group, a carboxylate group, or a quaternary ammonium salt thereof is preferable, a carboxylate group or a sulfonate group is more preferable, and a sulfonate group is still more preferable. As the basic group included in the pigment derivative, an amino group is preferable, and a tertiary amino group is more preferable.

As the pigment derivative, a quinoline pigment derivative, a benzimidazolone pigment derivative, or an isoindoline pigment derivative is preferable, and a quinoline pigment derivative or a benzimidazolone pigment derivative is more preferable.

The content of the pigment derivative in the pigment dispersion is preferably 1 to 50 mass % and more preferably 3 to 30 mass % with respect to the total mass of the pigments. Among these pigment derivatives, one kind may be used alone, or two or more kinds may be used in combination.

<<<<Organic Solvent>>>>

It is preferable that the pigment dispersion includes an organic solvent.

The organic solvent is selected in consideration of, for example, the solubility of each component included in the pigment dispersion and the application properties in a case where the pigment dispersion is applied to the coloring composition. As the organic solvent, esters, ethers, ketones, or aromatic hydrocarbons are used. Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, or propylene glycol monomethyl ether acetate is preferable. In addition, an organic solvent which can be included in the coloring composition described below can also be preferably used.

The content of the organic solvent in the pigment dispersion is preferably 50 to 95 mass % and more preferably 70 to 90 mass %.

<<Polymerizable Compounds>>

The coloring composition according to the present invention includes polymerizable compounds.

As the polymerizable compound, a well-known polymerizable compound which is a compound having a polymerizable group and is polymerizable by a radical can be used. As the polymerizable group, a group having an ethylenically unsaturated bond is preferable. Examples of the group having an ethylenically unsaturated bond include a vinyl group, an allyl group, a methallyl group, an acryloyl group, a methacryloyl group, an allyloxycarbonyl group, and a methallyloxycarbonyl group.

These polymerizable compounds may have any chemical form such as a monomer, a prepolymer (that is, a dimer, a trimer, or an oligomer), or a mixture or polymer thereof.

As the polymerizable compound, a compound having one or more polymerizable groups is preferable, and a compound having two or more polymerizable groups is more preferable from the viewpoint of sensitivity. Among these, a tetrafunctional or higher polyfunctional polymerizable compound having four or more polymerizable groups is preferable, and a pentafunctional or higher polyfunctional polymerizable compound is more preferable.

The molecular weight of the polymerizable compound is preferably 100 to 2000 and more preferably 1000 to 2000. In addition, a value obtained by dividing a value of the molecular weight of each of the polymerizable compound by the number of polymerizable groups in the polymerizable compound is preferably 100 to 300 and more preferably 200 to 300. According to this aspect, the crosslinking density of the polymerizable compound is appropriate, and thus corrugation can be more effectively suppressed.

The value of the molecular weight of the polymerizable compound denotes a theoretical value obtained from a molecular structure thereof in a case where the polymerizable compound is a monomer, and denotes the weight average molecular weight in a case where the polymerizable compound is an oligomer or a polymer.

<<Polymerizable Compound having Alkyleneoxy Chain>>

In the present invention, the polymerizable compounds include a polymerizable compound which has an alkyleneoxy chain including two or more alkyleneoxy groups as a repeating unit. Since the polymerizable compound having an alkyleneoxy chain has flexibility, shrinkage of a film caused by the curing of the polymerizable compound can be suppressed, and the corrugation of a surface of the film can be effectively suppressed.

The number of alkyleneoxy groups as the repeating unit in the alkyleneoxy chain is preferably 2 to 30, more preferably 2 to 20, and still more preferably 5 to 15.

The number of carbon atoms in the alkyleneoxy group is preferably 2 or more, more preferably 2 to 10, still more preferably 2 to 4, and even still more preferably 2. The alkyleneoxy group may be linear or branched and is preferably linear. It is preferable that the alkyleneoxy group is unsubstituted.

That is, it is preferable that the alkyleneoxy chain is represented by "—$((CH_2)_a—O)_b$—". In the formula, a represents preferably 2 or more and more preferably 2 to 20. b represents preferably 2 or more and more preferably 2 to 10.

It is preferable that the polymerizable compound having an alkyleneoxy chain is a polymerizable compound which has an ethyleneoxy chain including two or more ethyleneoxy groups as a repeating unit. Since the polymerizable compound having an ethyleneoxy chain is excellent in flexibility, the corrugation of a surface of a film can be effectively suppressed.

It is preferable that the polymerizable compound having an alkyleneoxy chain has a cyclic structure. Due to the cyclic structure, the adhesiveness is improved.

Examples of the cyclic structure include an aromatic cyclic structure, an alicyclic structure, a heterocyclic structure. A heterocyclic structure is preferable. It is preferable that a heterocycle of the heterocyclic structure is a 5- or 6-membered ring. The heterocycle is preferably a monocycle or a fused ring and more preferably a monocycle. Examples of a heteroatom constituting the heterocycle include a nitrogen atom, an oxygen atom, and a sulfur atom. Among these, a nitrogen atom is preferable. The number of heteroatoms is preferably 1 to 3, more preferably 2 or 3, and still more preferably 3.

It is preferable that the polymerizable compound having an alkyleneoxy chain has a partial structure represented by the following Formula (1). In Formula (1), * represents a direct bond.

(1)

Examples of the polymerizable compound having the partial structure includes a polymerizable compound represented by the following Formula (1a).

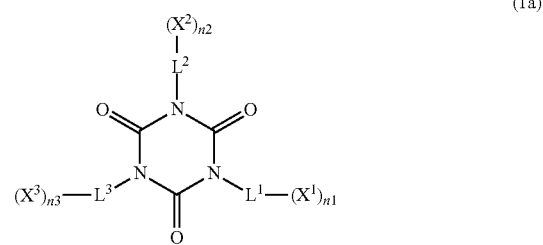

(1a)

In Formula (1a), $X^1$ to $X^3$ each independently represent a hydrogen atom or a polymerizable group, in which at least one of $X^1$, $X^2$, or $X^3$ represent a polymerizable group.

It is preferable that the polymerizable group is one or more selected from the group consisting of a vinyl group, an allyl group, a methallyl group, an acryloyl group, a methacryloyl group, an allyloxycarbonyl group, and a methallyloxycarbonyl group.

In Formula (1a), in a case where plural $X^1$'s, $X^2$'s, or $X^3$'s are present, plural $X^1$'s, $X^2$'s, or $X^3$'s may be the same as or different from each other.

In Formula (1a), $L^1$ represents a (1+n1) valent linking group, $L^2$ represents a (1+n2) valent linking group, $L^3$ represents a (1+n3) valent linking group, and at least one of $L^1$, $L^2$, or $L^3$ represents a linking group including —$((CH_2)_a—O)_b$—. a represents an integer of 2 or more, and b represents an integer of 2 or more.

In a case where the linking group represented by $L^1$ to $L^3$ is a divalent linking group, examples of the divalent linking group include one group or a group composed of a combination of two or more groups selected from —(($CH_2$)$_a$—O)$_b$—, —($CH_2$)$_c$—, —CO—, and —NH—.

a represents an integer of 2 or more, preferably 2 to 10, more preferably 2 to 4, and still more preferably 2.

b represents an integer of 2 or more, preferably 2 to 30, more preferably 2 to 20, and still more preferably 5 to 15.

c represents an integer of 1 or more, preferably 1 to 30, more preferably 1 to 20, and still more preferably 1 to 10.

In a case where the linking group represented by $L^1$ to $L^3$ is a trivalent or higher valent linking group, examples of the trivalent or higher valent linking group include groups obtained by removing one or more hydrogen atoms from the above-described examples of the divalent linking group.

In Formula (1a), n1 to n3 each independently represent an integer of 1 or more and preferably 1 or 2.

Specific examples of the polymerizable compound represented by Formula (1a) include the following compound.

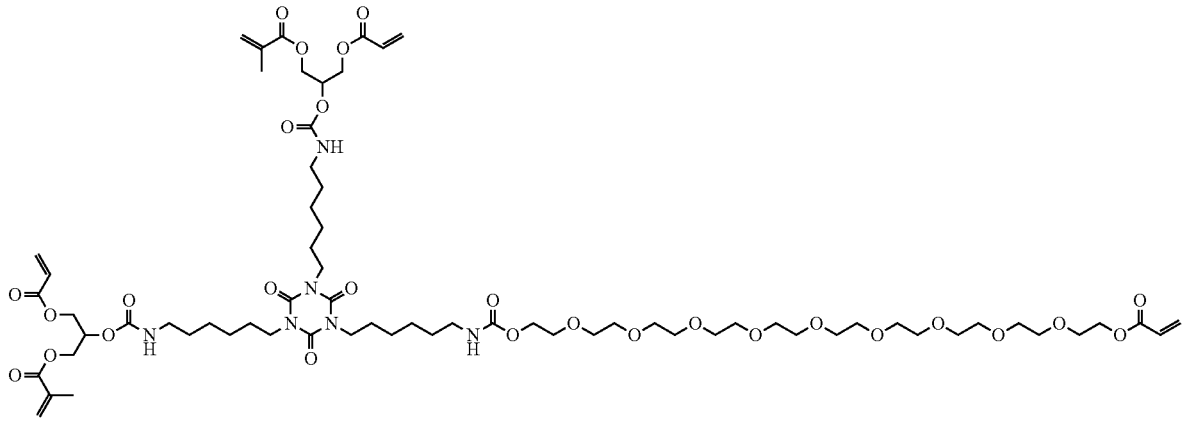 [SMILES: C=CC(=O)OCCOCCOCCOCCOCCOCCOCCOCCOCCOCCOC(=O)NCCCCCCn1c(=O)n(CCCCCCNC(=O)OC(COC(=O)C=C)COC(=O)C(=C)C)c(=O)n(CCCCCCNC(=O)OC(COC(=O)C=C)COC(=O)C(=C)C)c1=O]

Examples of a commercially available product of the polymerizable compound represented by Formula (1a) include UA-7200 (manufactured by Shin-Nakamura Chemical Co., Ltd.).

As the polymerizable compound having an alkyleneoxy chain, for example, at least one compound selected from the group consisting of compounds represented by the following formulae (Z-4) and (Z-5) can also be used.

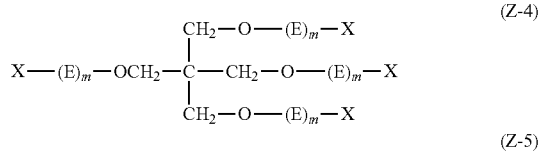

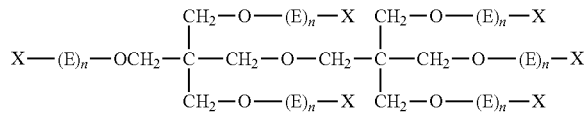

In Formulae (Z-4) and (Z-5), E's each independently represent —(($CH_2$)$_y$$CH_2$O)— or —(($CH_2$)$_y$CH($CH_3$)O)—, y's each independently represent an integer of 0 to 10, and X's each independently represent an acryloyl group, a methacryloyl group, a hydrogen atom, or a carboxyl group.

In Formula (Z-4), the total number of acryloyl groups and methacryloyl groups is 3 or 4, m's each independently represent an integer of 0 to 10, at least one m represent an integer of 2 to 10, and the sum of m's is an integer of 2 to 40.

In Formula (Z-5), the total number of acryloyl groups and methacryloyl groups is 5 or 6, n's each independently represent an integer of 0 to 10, at least one n represent an integer of 2 to 10, and the sum of n's is an integer of 2 to 60.

In Formula (Z-4), m represents preferably an integer of 0 to 6 and more preferably an integer of 0 to 4. In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in —(($CH_2$)$_y$$CH_2$O)— or —(($CH_2$)$_y$CH($CH_3$)O)— of Formula (Z-4) or (Z-5), a terminal thereof on an oxygen atom side is bonded to X.

Among these compounds represented by Formula (Z-4) and (Z-5), one kinds may be used alone, or two or more kinds may be used in combination. In particular, it is preferable that all of six X's in Formula (Z-5) represent an acryloyl group.

The compound represented by Formula (Z-4) or (Z-5) can be synthesized through well-known steps of the related art including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxyl group. The respective steps are well-known in the art, and those skilled in the art can easily synthesize the compound represented by Formula (Z-4) or (Z-5).

Among the compounds represented by Formula (Z-4) and (Z-5), a pentaerythritol derivative and/or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)"). Among these, Exemplary Compound (a), (b), (e), or (f) is preferable.

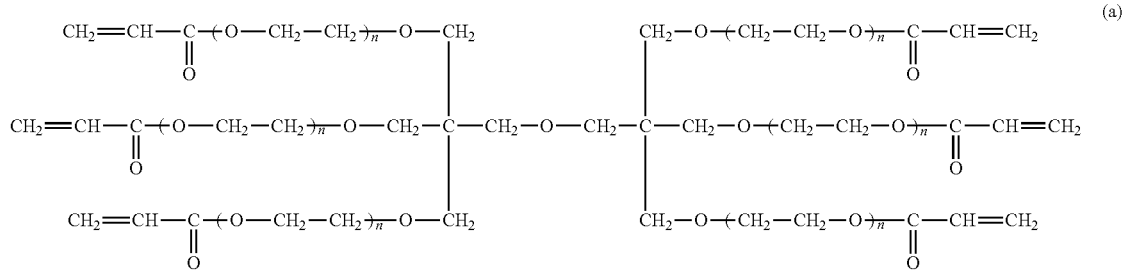
(The sum of n's is 6)
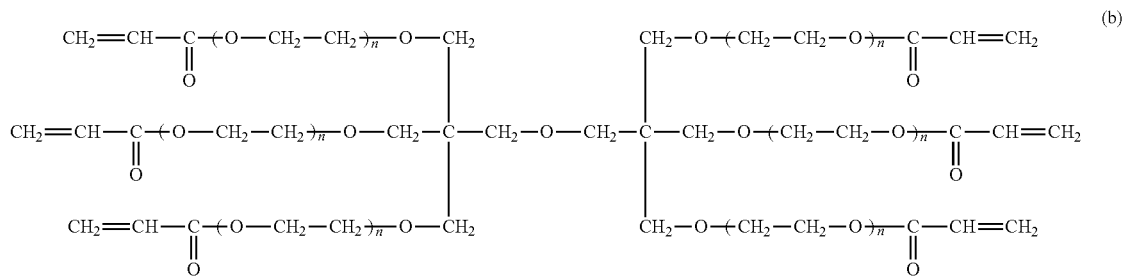
(The sum of n's is 12)
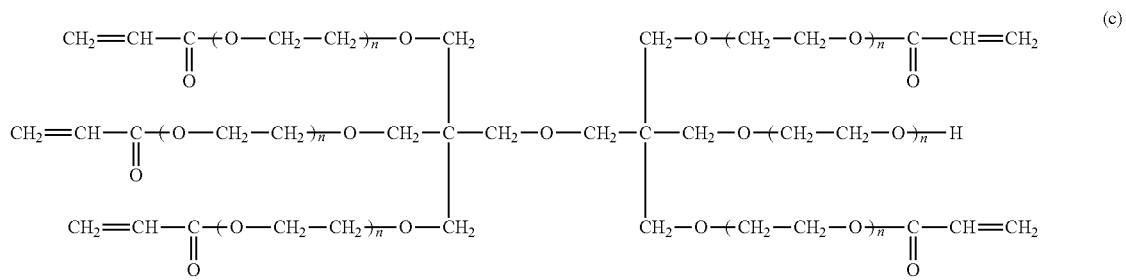
(The sum of n's is 12)
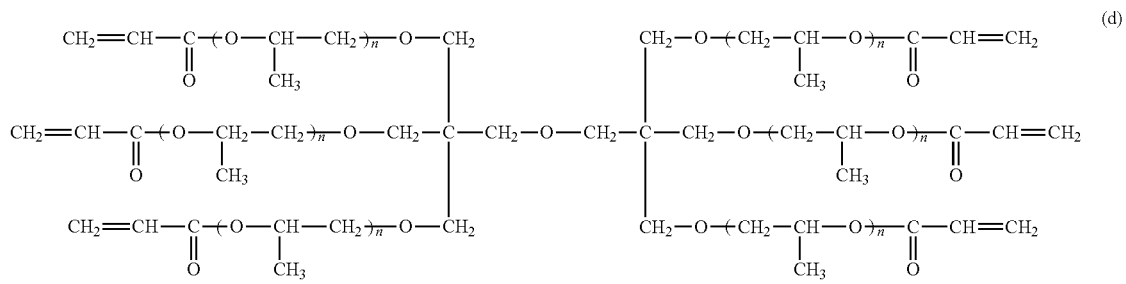
(The sum of n's is 6)
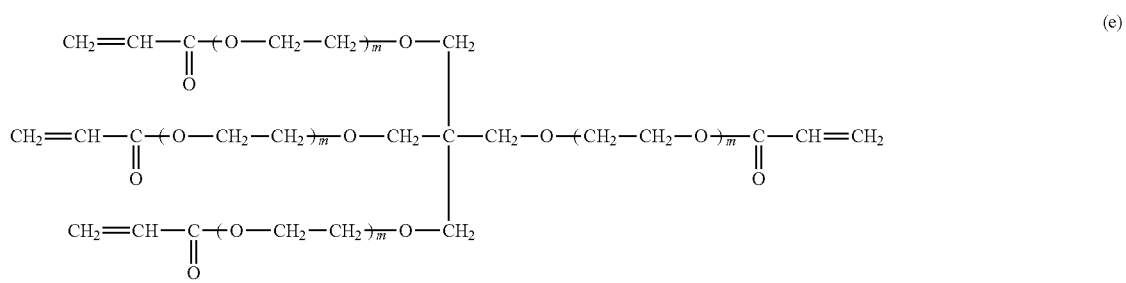
(The sum of m's is 4)

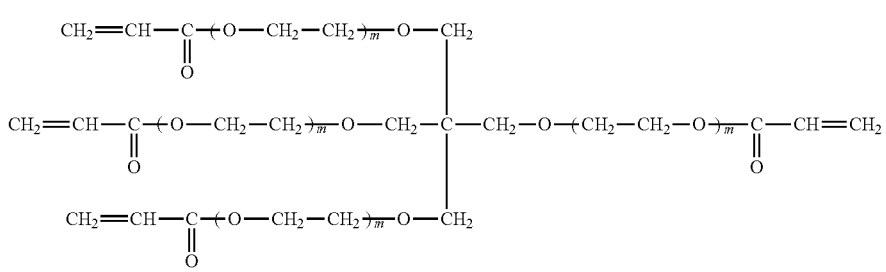

(f)

(The sum of m's is 12)

Examples of a commercially available product of the polymerizable compound represented by Formula (Z-4) or (Z-5) include SR-494 (manufactured Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

The content of the polymerizable compound having an alkyleneoxy chain in the polymerizable compounds used in the coloring composition according to the present invention is preferably 50 to 100 mass %, more preferably 80 to 100 mass %, and still more preferably 95 to 100 mass % with respect to the total mass of all the polymerizable compounds, and it is even still more preferable that only the polymerizable compound having an alkyleneoxy chain is used in the coloring composition.

<<<Other Polymerizable Compounds>>>

The coloring composition according to the present invention may include polymerizable compounds (hereinafter, referred to as "the other polymerizable compounds") other than the polymerizable compound having an alkyleneoxy chain. The other polymerizable compounds are not particularly limited, and well-known polymerizable compounds of the related art can be used.

Specific examples of the other polymerizable compounds include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable.

In addition, for example, an adduct of an unsaturated carboxylic acid ester or amide having a nucleophilic substituent, such as a hydroxyl group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid can also be used.

In addition, an adduct of an unsaturated carboxylic acid ester or amide having an electrophilic substituent such as an isocyanate group or an epoxy group with a monofunctional or polyfunctional alcohol, amine, or thiol, or a substitution reaction product of an unsaturated carboxylic acid ester or amide having a leaving substituent such as a halogen group or a tosyloxy group with a monofunctional or polyfunctional alcohol, amine, or thiol can also be used.

In addition, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be used in the present invention.

In addition, as the other polymerizable compound, a compound which has a boiling point at 100° C. or higher under normal pressure and has at least one ethylenically unsaturated group capable of addition polymerization can also be used. Examples of this compound include: a monofunctional (meth)acrylate such as polyethylene glycol mono (meth)acrylate, polypropylene glycol mono(meth)acrylate, or phenoxyethyl (meth)acrylate; a compound obtained by (meth)acrylation of a polyfunctional alcohol such as glycerin or trimethylolethane to which ethylene oxide or propylene oxide has been added, for example, polyethylene glycol di(meth)acrylate, trimethylol ethane tri(meth)acrylate, neopentyl glycol di(meth)acrylate, pentaerythritol tri (meth)acrylate, pentaerythritol tetra(meth)acrylate, dipentaerythritol penta(meth)acrylate, dipentaerythritol hexa (meth)acrylate, hexanediol (meth)acrylate, trimethylol propane tri(acryloyloxypropyl)ether, or tri(acryloyloxyethyl)isocyanurate; a urethane (meth)acrylate described in JP1973-41708B (JP-S48-41708B), JP1975-6034B (JP-S50-6034B), or JP1976-37193A (JP-S51-37193A); a polyester acrylate described in JP1973-64183A (JP-S48-64183A), JP1974-43191B (JP-S49-43191B), or JP1977-30490B (JP-S52-30490B); a polyfunctional acrylate or methacrylate such as an epoxy acrylate which is a reaction product of an epoxy resin and (meth)acrylic acid; and mixtures of the above-described compounds.

For example, a polyfunctional (meth)acrylate obtained by a reaction of a polyfunctional carboxylic acid with a compound having an ethylenically unsaturated group and a cyclic ether group such as glycidyl (meth)acrylate can also be used.

In addition, a cardo resin (for example, a compound having a fluorene ring and having two or more ethylenically unsaturated group) described in JP2010-160418A, JP2010-129825A, or JP4364216B can also be used.

In addition, regarding the other polymerizable compounds, as the compound which has a boiling point at 100° C. or higher under normal pressure and has at least one ethylenically unsaturated group capable of addition polymerization, a compound described in paragraphs "0254" to "0257" of JP2008-292970A can also be used.

In addition, polymerizable compounds represented by the following Formulae (MO-1) to (MO-5) can be used.

In a case where T in Formulae (MO-1) to (MO-5) represents an alkyleneoxy group, R is bonded to a terminal of a carbon atom side.

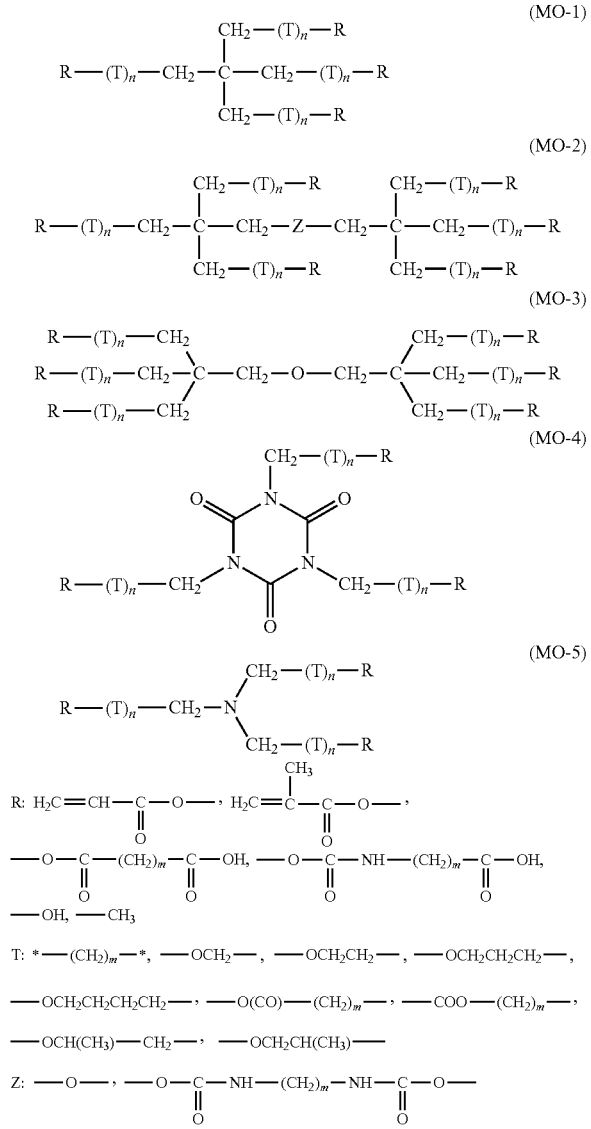

In Formulae (MO-1) to (MO-5), n represents 0 to 14, and m represents 1 to 8. Plural R's or plural T's which are present in one molecule may be the same as or different from each other.

At least one of plural R's which are present in Formulae (MO-1) to (MO-5) represents a group represented by —OC(=O)CH=CH$_2$ or —OC(=O)C(CH$_3$)=CH$_2$.

Specific examples of the polymerizable compounds represented by Formula (MO-1) to (MO-5) which are preferably used in the present invention include compounds described in paragraphs "0248" to "0251" of JP2007-269779A.

In addition, as the other polymerizable compound, compounds obtained by (meth)acrylation of a polyfunctional alcohol to which ethylene oxide or propylene oxide has been added described in Formulae (1) and 2 of JP1998-62986A (JP-H10-62986A) together with specific examples thereof can also be used.

Among these, as the other polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), ethyleneoxy-modified dipentaerythritol hexaacrylate (A-DPH-12E as a commercially available product; manufactured by Shin-Nakamura Chemical Co., Ltd.), and a structure in which these (meth)acryloyl group is bonded through an ethylene glycol or a propylene glycol residue is preferable.

In addition, preferable examples of the polymerizable compound include 2-(meth)acryloyloxy ethyl caproate acid phosphate (PM-20 as a commercially available product; manufactured by Nippon Kayaku Co., Ltd.), urethane acrylate (U-6LPA as a commercially available product; manufactured by Shin-Nakamura Chemical Co., Ltd.), and pentaerythritol tri- or tetraacrylate (M-303, M-305, M-306, M-450, or M-452 as commercially available products; manufactured by Toagosei Co., Ltd.).

In addition, as the other polymerizable compounds, a polymerizable compound having a caprolactone structure can be used.

The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a polymerizable compound having a caprolactone structure represented by the following Formula (Z-1) is preferable.

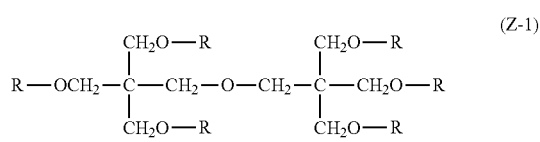

In Formula (Z-1), all of six R's represent a group represented by the following Formula (Z-2), or one to five R's among the six R's represent a group represented by the following Formula (Z-2) and the remaining R's represent a group represented by the following Formula (Z-3).

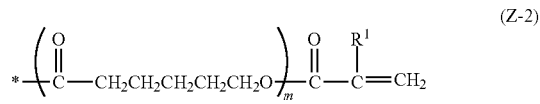

In Formula (Z-2), R$^1$ represents a hydrogen atom or a methyl group, m represents 1 or 2, and "*" represents a direct bond.

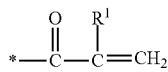
(Z-3)

In Formula (Z-3), $R^1$ represents a hydrogen atom or a methyl group, and "*" represents a direct bond.

The polymerizable compound having a caprolactone structure is commercially available as for example, KAYARAD DPCA series (manufactured by Nippon Kayaku Co., Ltd.), and examples thereof include DPCA-20 (a compound in which m=1 in Formulae (Z-1) to (Z-3), the number of groups represented by Formula (Z-2)=2, and all of $R^1$'s represent a hydrogen atom), DPCA-30 (a compound in which m=1 in Formulae (Z-1) to (Z-3), the number of groups represented by Formula (Z-2)=3, and all of $R^1$'s represent a hydrogen atom), DPCA-60 (a compound in which m=1 in Formulae (Z-1) to (Z-3), the number of groups represented by Formula (Z-2)=6, and all of $R^1$'s represent a hydrogen atom), and DPCA-120 (a compound in which m=2 in Formulae (Z-1) to (Z-3), the number of groups represented by Formula (Z-2)=6, and all of $R^1$'s represent a hydrogen atom).

The content of the polymerizable compounds in the coloring composition according to the present invention is preferably 25 to 65 mass %, more preferably 25 to 60 mass %, and still more preferably 25 to 50 mass % with respect to the total solid content of the coloring composition. In a case where the content of the polymerizable compounds is in the above-described range, a film having a large thickness is likely to be formed. Further, in a case where the coloring composition is applied in a film shape, the curing properties of a surface of the film can be made to be same as those of the inside of the film, and the corrugation can be more effectively suppressed. Furthermore, during the formation of a pattern, the formation of a residue can be suppressed.

In the coloring composition according to the present invention, the ratio P/M of the mass P of the colorants included in the coloring composition to the mass M of the polymerizable compounds included in the coloring composition is preferably 0.05 to 0.35 and more preferably 0.1 to 0.35. According to this aspect, in a case where the coloring composition is applied in a film shape, the curing properties of a surface of the film can be made to be same as those of the inside of the film, and the corrugation can be more effectively suppressed. Further, a film capable of allowing transmission of near infrared rays in a state noise generated from visible rays is smaller can be formed. Furthermore, during the formation of a pattern, the formation of a residue can be suppressed.

<<Polyfunctional Thiol Compound>>

In order to promote a reaction of the polymerizable compound, the coloring composition according to the present invention may include a polyfunctional thiol compound having two or more mercapto groups in a molecule. The polyfunctional thiol compound is preferably a secondary alkanethiol and more preferably a compound having a structure represented by the following Formula (I).

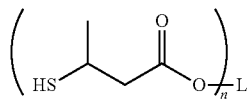

Formula (I)

(In Formula (I), n represents an integer of 2 to 4, and L represents a divalent to tetravalent linking group.)

In Formula (I), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol compound include compounds represented by the following Structural Formulae (II) to (IV). Among these, a compound represented by Structural Formula (II) is preferable. Among these polyfunctional thiols compounds, one kind may be used alone, or two or more kinds may be used in combination.

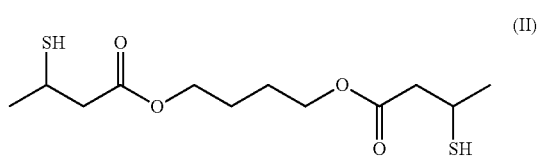
(II)

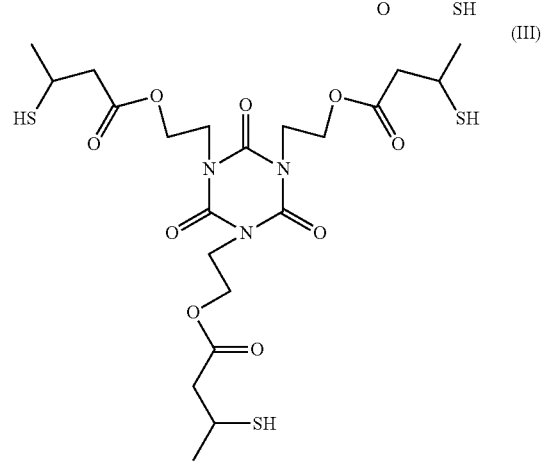
(III)

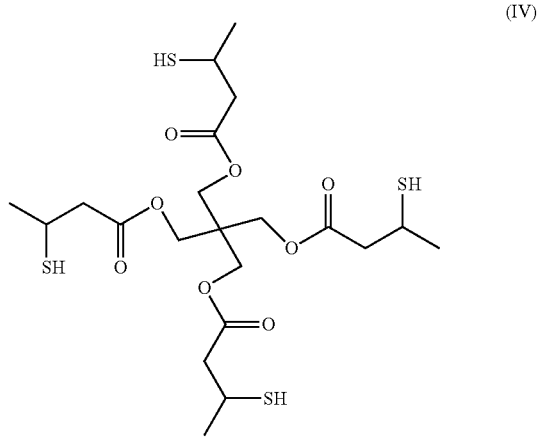
(IV)

The amount of the polyfunctional thiol compound added to the coloring composition is preferably 0.3 to 8.9 mass % and more preferably 0.8 to 6.4 mass % with respect to the total solid content of the coloring composition excluding a solvent.

Among the polyfunctional thiol compounds, one kind may be used alone, or two or more kinds may be used in combination. In a case where two or more polyfunctional thiol compounds are used, it is preferable that the total content of the two or more polyfunctional thiol compounds is in the above-described range.

In addition, the polyfunctional thiol compound may be added in order to improve stability, odor, resolution, developability, adhesiveness, and the like.

<<Resin>>

The coloring composition according to the present invention includes a resin. In the present invention, "resin" does not include "polymerizable compound".

It is preferable that the resin has a hydroxyl group. By the resin having a hydroxyl group, the adhesiveness of the resin with the substrate can be improved.

The content of the resin in the coloring composition according to the present invention is preferably 10 to 80 mass %, more preferably 20 to 70 mass %, and still more preferably 30 to 60 mass % with respect to the total solid content of the coloring composition.

In the coloring composition according to the present invention, a ratio M/B of the mass M of the polymerizable compounds included in the coloring composition to a mass B of the resin included in the coloring composition is preferably 0.4 to 3.0, more preferably 0.4 to 0.9, and still more preferably 0.4 to 0.8. According to this aspect, in a case where the coloring composition is applied in a film shape, the curing properties of a surface of the film can be made to be same as those of the inside of the film, and the corrugation can be more effectively suppressed.

Examples of the resin include the above-described dispersion resin and an alkali-soluble resin described below.

Hereinafter, the alkali-soluble resin will be described.

<<<Alkali-Soluble Resin>>>

The coloring composition according to the present invention can include an alkali-soluble resin as a resin. By the coloring composition including the alkali-soluble resin, developability and pattern formability is improved.

The molecular weight of the alkali-soluble resin is not particularly limited, and the weight average molecular weight (Mw) thereof is preferably 5000 to 100000. In addition, the number average molecular weight (Mn) of the alkali-soluble resin is preferably 1000 to 20000.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain).

The alkali-soluble resin will be described.

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkaline aqueous solution is preferable, and (meth)acrylic acid is more preferable. Among these acid groups, one kind may be used alone, or two or more kinds may be used in combination.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxylic acid at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphtyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer copolymer described in JP1998-300922A (JP-H10-300922A) include N-phenylmaleimide and N-cyclohexylmaleimide. Among these monomers which are copolymerizable with the (meth)acrylic acid, one kind may be used alone, or two or more kinds may be used in combination.

The alkali-soluble phenol resin can be suitably used in a case where the coloring composition is a positive composition. Examples of the alkali-soluble phenol resin include a novolac resin and a vinyl polymer.

Examples of the novolac resin include a resin which is obtained by condensation of a phenol and an aldehyde in the presence of an acid catalyst. Examples of the phenol include phenol, cresol, ethyl phenol, butyl phenol, xylenol, phenyl phenol, catechol, resorcinol, pyrogallol, naphthol, and bisphenol A. Examples of the aldehyde include formaldehyde, paraformaldehyde, acetaldehyde, propionaldehyde, and benzaldehyde. Among the phenols and the aldehydes, one kind may be used alone, or two or more kinds may be used in combination.

Specific examples of the novolac resin include a condensate of metacresol, paracresol, or a mixture of metacresol and paracresol with formalin.

The molecular weight distribution of the novolac resin may be adjusted by means of fractionation or the like. In addition, the novolac resin may be mixed with a low molecular weight component having a phenolic hydroxyl group such as bisphenol C or bisphenol A.

In addition, in order to improve a crosslinking effect of the coloring composition, an alkali-soluble resin having a polymerizable group may be used. Examples of the polymerizable group include an allyl group, a methallyl group, and a (meth)acryloyl group. As the alkali-soluble resin having a polymerizable group, an alkali-soluble resin having a polymerizable group at a side chain thereof is preferable.

Preferable examples of the alkali-soluble resin having a polymerizable group include: a urethane-modified alkali-soluble resin obtained by a reaction of a compound having a polymerizable group such as a (meth)acryloyl group, in which one unreacted isocyanate group remains by a previous reaction of isocyanate groups and hydroxyl groups, with an acrylic resin having a carboxyl group; an alkali-soluble resin obtained by a reaction of an acrylic resin having a carboxyl group with a compound having both an epoxy group and a polymerizable double bond in a molecule thereof; an acid pendant type epoxy acrylate resin; an alkali-soluble resin obtained by a reaction of an acrylic resin having a hydroxyl group with a dibasic acid anhydride having a polymerizable double bond; an alkali-soluble resin obtained by a reaction of an acrylic resin having a hydroxyl group with a compound having isocyanate and a polymerizable group; an alkali-soluble resin described in JP2002-229207A or JP2003-335814A obtained by performing a basic treatment on a resin having a halogen atom or a leaving group such as a sulfonate group at the α-position or at the β-position and having an ester group at a side chain.

Examples of the alkali-soluble resin having a polymerizable group include Dianal NR series (manufactured by Mitsubishi Rayon Co., Ltd.), Photomer 6173 (a COOH-containing polyurethane acrylic oligomer; manufactured by Diamond Shamrock Co., Ltd.), Biscoat R-264 and KS Resist 106 (both of which are manufactured by Osaka Organic Chemical Industry Ltd.), Cyclomer-P series and Plakcel CF200 series (both of which manufactured by Daicel Corporation), and Ebecryl 3800 (manufactured by Daicel-UCB Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H07-140654A) obtained by copolymerization of 2-hydroxyethyl (meth) acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; and a copolymer including 2-hydroxyethyl methacrylate, a polystyrene macromonomer, benzyl methacrylate, and methacrylic acid.

As the alkali-soluble resin, a resin (a) obtained by polymerization of monomer components including a compound represented by the following Formula (ED) and/or a compound represented by the following Formula (ED2) (hereinafter, these compounds will also be referred to as "ether dimer") is also preferable.

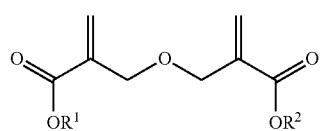

Formula (ED)

In Formula (ED), $R^1$ and $R^2$ each independently represent a hydrogen atom or a hydrocarbon group having 1 to 25 carbon atoms which may have a substituent.

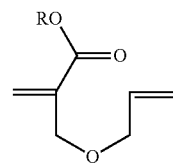

Formula (ED2)

In Formula (ED2), R represents a hydrogen atom or an organic group having 1 to 30 carbon atoms. Specific examples of Formula (ED2) can be found in the description of JP2010-168539A In Formula (ED), it is preferable that the hydrocarbon group represented by $R^1$ or $R^2$ is a hydrocarbon group having 1 to 25 carbon atoms. The hydrocarbon group may have a substituent.

The hydrocarbon group is not particularly limited, and examples thereof include a linear or branched alkyl group such as methyl, ethyl, n-propyl, isopropyl, n-butyl, isobutyl, t-butyl, t-amyl, stearyl, lauryl, or 2-ethylhexyl; an aryl group such as phenyl; an alicyclic group such as cyclohexyl, t-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a hydrocarbon group having a primary or secondary carbon atom which is not likely to leave due to an acid or heat, for example, methyl, ethyl, cyclohexyl, or benzyl is preferable from the viewpoint of heat resistance.

Specific examples of the ether dimer include dimethyl-2, 2'-[oxybis(methylene)]bis-2-propenoate, diethyl-2,2'-[oxybis(methyl ene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, or dibenzyl-2,2'-[oxybis(methylene)]bis-2-propenoate is preferable. Among these ether dimers, one kind may be used alone, or two or more kinds may be used in combination.

The content of the ether dimer in the monomer components is not particularly limited and is preferably 2 to 60 mass %, more preferably 5 to 55 mass %, and still more preferably 5 to 50 mass %.

The resin (a) may be a copolymer obtained by copolymerization of the ether dimer and another monomer.

Examples of the other monomer which is copolymerizable with the ether dimer include a monomer for introducing an acid group, a monomer for introducing a radically polymerizable double bond, a monomer for introducing an epoxy group, and another copolymerizable monomer other than the above-described monomers. Among these monomers, one kind may be used alone, or two or more kinds may be used in combination. The above-described other monomers can be found in, for example, the description of "0016" to "0022" of JP2004-300204A, the content of which is incorporated herein by reference.

The weight average molecular weight (Mw) of the resin (a) is not particularly limited and, from the viewpoints of the viscosity of the coloring composition and the heat resistance of a film formed using the coloring composition, is preferably 5000 to 200000, more preferably 5000 to 100000, and still more preferably 5000 to 20000.

In addition, in a case where the resin (a) has an acid group, the acid value of the resin (a) is preferably 30 to 500 mgKOH/g and more preferably 50 to 400 mgKOH/g.

The resin (a) can be easily obtained by polymerization of monomers including the ether dimer. At this time, cyclization of the ether dimer progresses along with polymerization such that a tetrahydropyran ring structure is formed.

A polymerization method used for the synthesis of the resin (a) is not particularly limited and various well-known polymerization methods of the related art can be used. In particular, a solution polymerization method is preferable. Specifically, the resin (a) can be synthesized, for example, using a synthesis method of the resin (a) described in JP2004-300204A.

Hereinafter, exemplary compounds of the resin (a) are shown, but the present invention is not limited thereto. Composition ratios of the following exemplary compounds are represented by mol %.

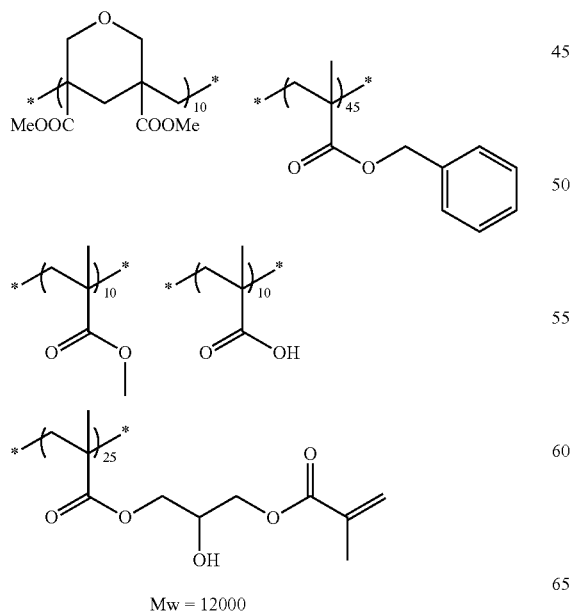

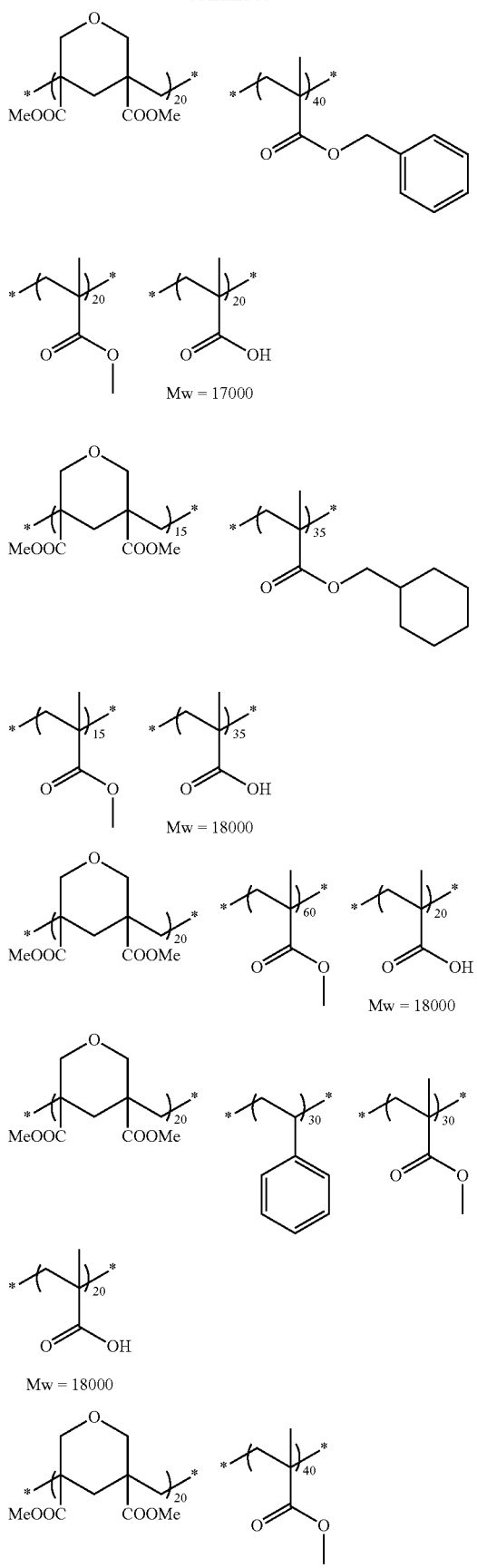

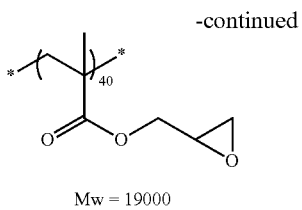

Mw = 19000

As the alkali-soluble resin, a resin including a structural unit which is derived from an ethylenically unsaturated monomer represented by the following Formula (X) can also be used.

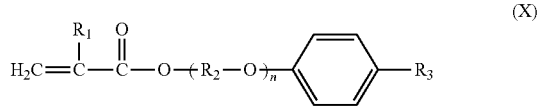

(In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms which may have a benzene ring, and n represents an integer of 1 to 15.)

In Formula (X), the number of carbon atoms in the alkylene group of $R_2$ is preferably 2 to 3. In addition, the number of carbon atoms in the alkyl group of $R_3$ is preferably 1 to 10. The alkyl group of $R_3$ may include a benzene ring. Examples of the alkyl group having a benzene ring represented by $R_3$ include a benzyl group and a 2-phenyl (iso)propyl group.

Specific examples of the resin including a structural unit which is derived from an ethylenically unsaturated monomer represented by Formula (X) include resins described in JP2012-247591A and JP2013-24934A.

The acid value of the alkali-soluble resin is preferably 30 to 500 mgKOH/g. The lower limit is 50 mgKOH/g or higher and more preferably 70 mgKOH/g or higher. The upper limit is preferably 400 mgKOH/g or lower, more preferably 200 mgKOH/g or lower, still more preferably 150 mgKOH/g or lower, and most preferably 120 mgKOH/g or lower.

The content of the alkali-soluble resin is preferably 10 to 80 mass %, more preferably 20 to 70 mass %, and still more preferably 30 to 60 mass % with respect to the total solid content of the coloring composition.

<<Photopolymerization Initiator>>

It is preferable that the coloring composition according to the present invention includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light rays in a range from the ultraviolet region to the visible region is preferable. In addition, the photopolymerization initiator may be a photopolymerization initiator which causes an action with a photo-excited sensitizer to generate active radicals, or may be an photopolymerization initiator which initiates cation polymerization depending on the kinds of polymerizable compounds.

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound (for example, benzophenone, 2-methylbenzophenone, 4,4'-bis(diethylamino)benzophenone, 2-methyl-1-[4-(methylthio)phenyl]-2-morpholino-1-propane, benzoin, benzoin methyl ether, acridone, N-methylacridone, or 2-benzyl-dimethyl amino-1-(4-morpholinophenyl)-1-butanone), an aromatic onium salt, keto oxime ether, an aminoacetophenone compound, and hydroxyacetophenone. Among these, an oxime compound is preferable.

Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H05-281728A), a compound described in JP1993-34920A (JP-S05-34920A), and a compound described in U.S. Pat. No. 4,212,976A (for example, a compound having an oxadiazole skeleton).

In addition, examples of the photopolymerization initiator other than the above-described examples include an acridine derivative (for example, 9-phenylacridine or 1,7-bis(9,9'-acridinyl)heptane), N-phenylglycine, a polyhalogen compound (for example, carbon tetrabromide, phenyl tribromomethyl sulfone, or phenyl trichloromethyl ketone), a coumarin (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-di ethylaminocinnamoyl)-7-diethylaminocoumarin, 7-methoxy-3-(3-pyridyl carbonyl)coumarin, 3-benzoyl-5,7-dipropoxycoumarin, 7-benzotriazol-2-ylcoumarin, or a coumarin compound described in JP1993-19475A (JP-H05-19475A), JP1995-271028A (JP-H07-271028A), JP2002-363206A, JP2002-363207A, JP2002-363208A, or JP2002-363209A), an acylphosphine oxide (for example, bis(2,4,6-trimethylbenzoyl)-phenylphosphine oxide, bis(2,6-dimethoxybenzoyl)-2,4,4-trimethyl-pentylphenylphosphine oxide, or Lucirin TPO), a metallocene (for example, bis($\eta$5-2,4-cyclopentadien-1-yl)-bis(2,6-difluoro-3-(1H-pyrrol-1-yl)-phenyl)titanium or $\eta$5-cyclopentadienyl-$\eta$6-cumenyl-iron(1+)-hexafluorophosphate (1-)), a compound described in JP1978-133428A (JP-553-133428A), JP1982-1819B (JP-S57-1819B), JP1982-6096B (JP-557-6096B), or U.S. Pat. No. 3,615,455A.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine oxide initiator described in JP4225898B can also be used.

As the hydroxyacetophenone initiator, for example, IRGACURE-184, DAROCUR-1173, IRGACURE-500, IRGACURE-2959, or IRGACURE-127 (trade name, all of which are manufactured by BASF SE) can be used. As the aminoacetophenone initiator, IRGACURE-907, IRGACURE-369, or IRGACURE-379 (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used. As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

By the coloring composition including an oxime compound as a photopolymerization initiator, the dependence (also referred to as "PCD dependence") of a pattern on a period of time from coating to exposure of the coloring composition (post coating delay: PCD) is improved.

Specific examples of the oxime compound include a compound described in JP2001-233842A, a compound described in JP2000-80068A, and a compound described in JP2006-342166A.

Examples of the oxime compound which can be preferably used as a photopolymerization initiator include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of the oxime compound include a compound described in J.C.S. Perkin II (1979), pp. 1653-1660; J.C.S. Perkin II (1979), pp. 156-162, Journal of Photopolymer Science and Technology (1995), pp. 202-232, or JP2000-66385A; and a compound described in JP2000-80068A, JP2004-534797A, or JP2006-342166A.

Examples of a commercially available product which can be preferably used include: IRGACURE OXE-01 (manufactured by BASF SE) and IRGACURE OXE-02 (manufactured by BASF SE); TRONLY TR-PBG-304, TRONLY TR-PBG-309, and TRONLY TR-PBG-305, (all of which are manufactured by Changzhou Tronly New Electronic Materials Co., Ltd.); and ADEKA ARKLS NCI-831 and ADEKA ARKLS NCI-930 (all of which are manufactured by ADEKA Corporation).

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US2009/292039A in which a nitro group is introduced into a dye site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group. Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

Hereinafter, specific examples of the oxime compound which are preferably used are shown, but the present invention is not limited thereto.

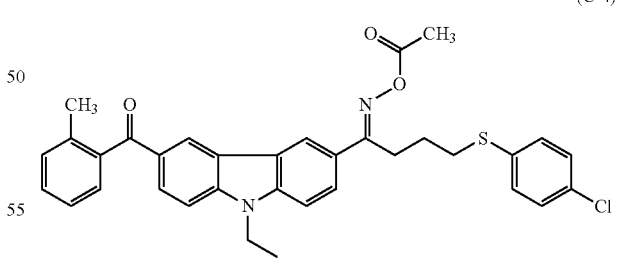

(C-4)

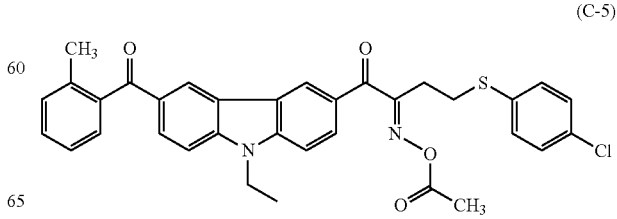

(C-5)

(C-6)
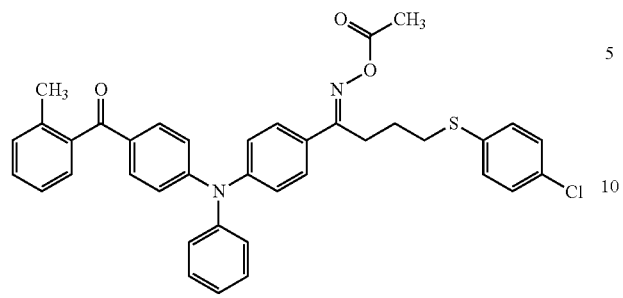

(C-7)
(C-8)
(C-9)

(C-10)
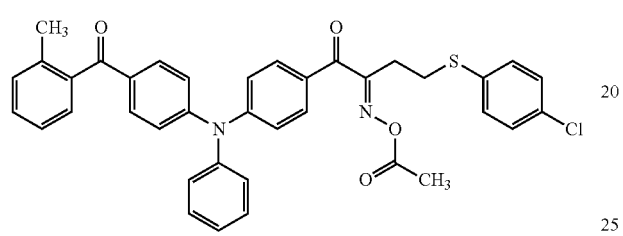

(C-11)
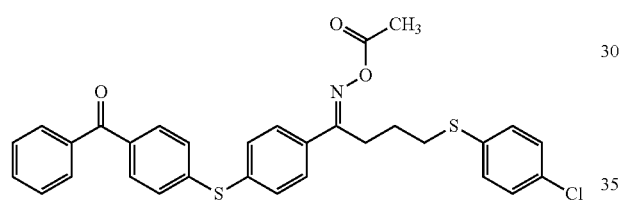

(C-12)
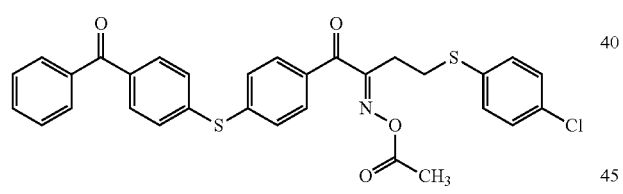

(C-13)
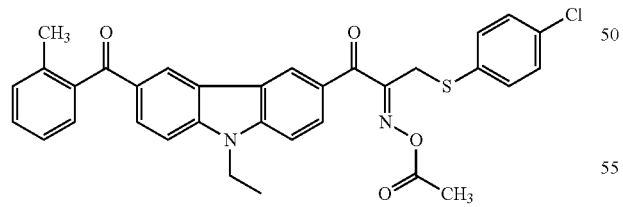

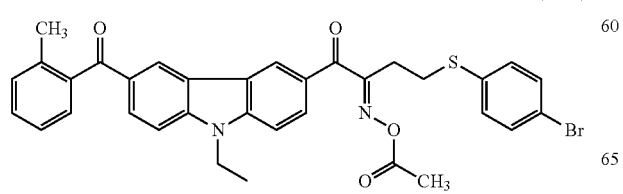

The oxime compound has an absorption maximum in a wavelength range of 350 nm to 500 nm, preferably has an absorption maximum in a wavelength range of 360 nm to 480 nm, and more preferably has a high absorbance at 365 nm and 405 nm.

The molecular absorption coefficient of the oxime compound at 365 nm or 405 nm is preferably 1000 to 300000, more preferably 2000 to 300000, and still more preferably 5000 to 200000 from the viewpoint of sensitivity.

The molecular absorption coefficient of the compound can be measured using a well-known method. Specifically, for example, it is preferable that the absorption coefficient can be measured using an ultraviolet-visible spectrophotometer (Cary-5 spectrophotometer, manufactured by Varian Medical Systems, Inc.) and ethyl acetate at a concentration of 0.01 g/L.

The content of the photopolymerization initiator is preferably 0.1 to 20 mass %, more preferably 0.5 to 10 mass %, and still more preferably 1 to 8 mass % with respect to the total solid content of the coloring composition. In the above-described range, excellent sensitivity and pattern formability can be obtained.

Among the photopolymerization initiators, one kind may be used alone, or two or more kinds may be used in combination. In a case where two or more photopolymerization initiators are used in combination, it is preferable that the total content of the photopolymerization initiators is in the above-described range.

<<Ultraviolet Absorber>>

The coloring composition according to the present invention can include a ultraviolet absorber.

It is preferable that the ultraviolet absorber is a compound having an absorption coefficient of higher than 100 per gram at a wavelength of 365 nm and having an absorption coefficient of 10 or lower per gram at a wavelength of 400 nm or longer. In a case where the absorption coefficient per gram at a wavelength of 365 nm is higher than 100, an excellent ultraviolet absorbing effect can be obtained from even a small amount of the ultraviolet absorber. In addition, in a case where the absorption coefficient per gram at a wavelength of 400 nm or longer is 10 or lower, the effect on the device spectrum in the visible region can be reduced. The absorption coefficient can be measured using an ultraviolet-visible spectrophotometer (Cary-5 spectrophotometer, manufactured by Varian Medical Systems, Inc.) and ethyl acetate at a concentration of 0.01 g/L.

As the ultraviolet absorber, a compound represented by the following Formula (I) which is a conjugated diene compound is preferable. In a case where this conjugated diene compound is used, a variation in development performance especially after low-illuminance exposure can be suppressed, and the dependence on exposure illuminance relating to pattern formability such as a line width of a pattern, a film thickness, or an optical spectrum can be more effectively suppressed.

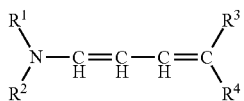

Formula (1)

In Formula (I), $R^1$ and $R^2$ each independently represent a hydrogen atom, an alkyl group having 1 to 20 carbon atoms, or an aryl group having 6 to 20 carbon atoms and may be the same as or different from each other. In this case, both $R^1$ and $R^2$ do not represent a hydrogen atom at the same time.

$R^3$ and $R^4$ represent an electron-withdrawing group. The Hammett substituent constant $\sigma_p$ value (hereinafter, referred to simply as "$\sigma_p$ value") of the electron-withdrawing group is preferably 0.20 to 1.0 and more preferably 0.30 to 0.8.

The Hammett rule is an experimental rule proposed by L. P. Hammett in 1935 in order to quantitatively discuss an effect of a substituent on a reaction or a equilibrium of a benzene derivative. The validity of the Hammett rule is widely admitted nowadays. Substituent constants obtained by the Hammett rule are an $\sigma_p$ value and an $\sigma_m$ value, and these values can be found in many general books. For example, the detail can be found in "Lange's Handbook of Chemistry" 12th edition, edited by J. A. Dean, 1979 (McGraw Hill), "Kagaku no Ryoiki (Journal of Japanese Chemistry) special edition" vol. 122, pp. 96-103, 1979 (Nankodo), and "Chemical Reviews" vol. 91, pp. 165-195, 1991. The substituents according to the present invention are not limited to those whose constants are known in the above-described references. It is needless to say that even substituents whose constants are not known in the references are also included in the substituents according to the present invention as long as the constants of the substituents measured according to Hammett rule fall within the defined range.

It is preferable that $R^3$ represent a group selected from a cyano group, —COOR$^5$, —CONHR$^5$, —COR$^5$, and —SO$_2$R$^5$. It is preferable that $R^4$ represent a group selected from a cyano group, —COOR$^6$, —CONHR$^6$, —COR$^6$, and —SO$_2$R$^6$. $R^5$ and $R^6$ each independently represent an alkyl group having 1 to 20 carbon atoms or an aryl group having 6 to 20 carbon atoms.

$R^3$ and $R^4$ may be bonded to each other to form a ring.

At least one of $R^1$, $R^2$, $R^3$, or $R^4$ may represent a polymer obtained from a monomer which is bonded to a vinyl group through a linking group. In addition, at least one of $R^1$, $R^2$, $R^3$, or $R^4$ may represent a copolymer obtained from the above polymer and another monomer.

Hereinafter, specific preferable examples [Exemplary Compounds (1) to (14)] of the compound represented by Formula (I) will be shown. However, the present invention is not limited to these exemplary compounds.

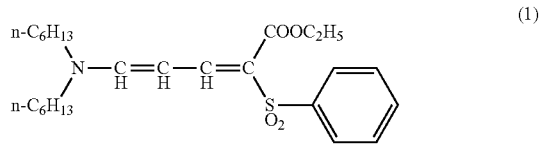

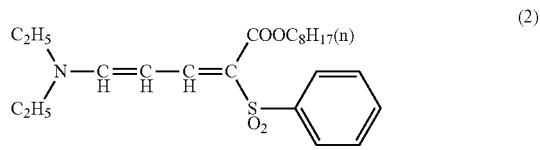

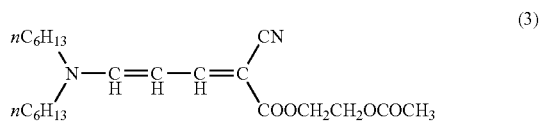

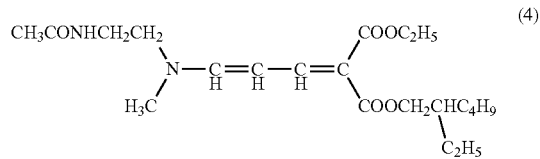

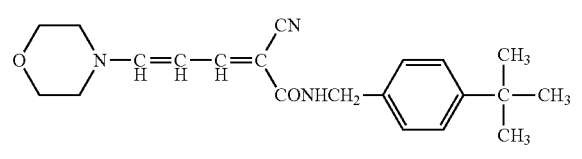

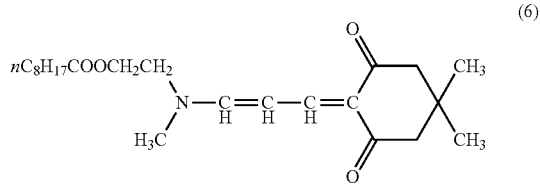

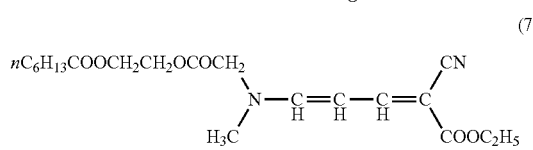

-continued

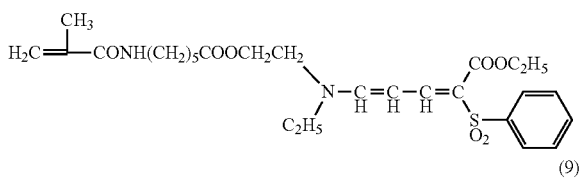
(8)

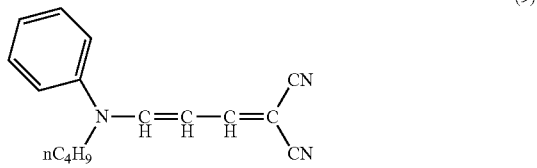
(9)

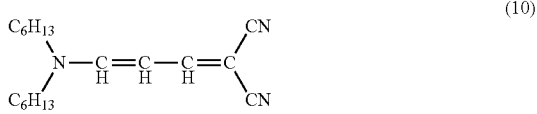
(10)

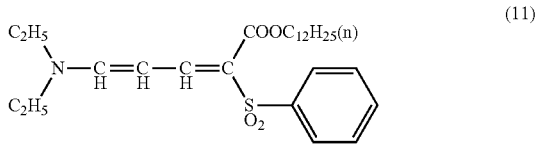
(11)

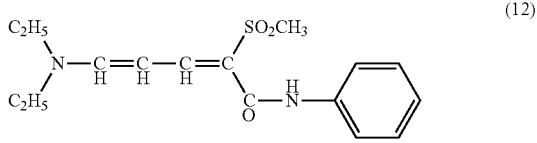
(12)

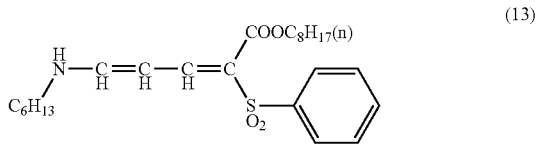
(13)

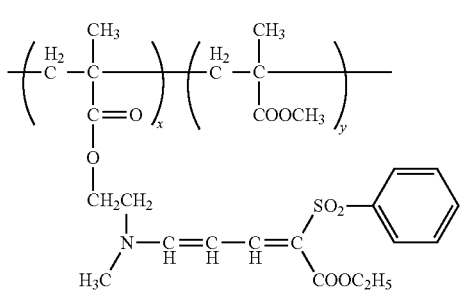
(14)

x:y = 80:20
(mass ratio)

The compound represented by Formula (I) can be synthesized using a method described in JP1969-29620B (JP-S44-29620B), JP1978-128333A (JP-S53-128333A), JP1986-169831A (JP-S61-169831A), JP1988-53543A (JP-S63-53543A), JP1988-53544A (JP-S63-53544A), or JP1988-56651A (JP-S63-56651A).

The coloring composition according to the present invention may or may not include a ultraviolet absorber. In a case where the coloring composition according to the present invention includes a ultraviolet absorber, the content of the ultraviolet absorber in the coloring composition is preferably 0.01 to 10 mass % and more preferably 0.01 to 5 mass % with respect to the total solid content of the coloring composition according to the present invention. In a case where the content of the ultraviolet absorber is in the above-described range, the sensitivity is excellent, and a fine pattern shape (in particular, a rectangular shape) can be formed with higher accuracy.

Among the ultraviolet absorbers, one kind may be used alone, or two or more kinds may be used in combination. In a case where two or more ultraviolet absorbers are used in combination, it is preferable that the total content of the ultraviolet absorbers is in the above-described range.

In a case where the coloring composition according to the present invention includes a photopolymerization initiator and a ultraviolet absorber, a ratio (D/B) of a mass (D) of the photopolymerization initiator to a mass (B) of the ultraviolet absorber is in a range of preferably 0.25 to 1.25, more preferably 0.3 to 1.1, and still more preferably 0.4 to 1.0. In a case where the ratio is in the above-described range, the sensitivity is excellent, and a fine pattern shape (in particular, a rectangular shape) can be formed with higher accuracy.

<<Organic Solvent>>

The coloring composition according to the present invention can include an organic solvent. Basically, the organic solvent is not particularly limited as long as it satisfies the solubility of each component and the application properties of the coloring composition. However, it is preferable that the organic solvent is selected in consideration of the solubility of the ultraviolet absorber, the alkali-soluble resin, and the like, the application properties of the coloring composition, and safety.

Preferable examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclopentanone, cyclohexanone, 2-heptanone, or 3-heptanone; and an aromatic hydrocarbon, for example, toluene or xylene.

Among these organic solvents, one kind may be used alone, or two or more kinds may be used in combination.

In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

The amount of the organic solvent included in the coloring composition is preferably 10 to 90 mass %, more preferably 20 to 80 mass %, still more preferably 25 to 75 mass %, and even still more preferably 45 to 65 mass % with respect to the total mass of the coloring composition.

<<Sensitizer>>

The coloring composition according to the present invention may include a sensitizer in order to improve the radical generation efficiency of the photopolymerization initiator and to increase a photosensitive wavelength.

As the sensitizer, for example, a sensitizer having an absorption wavelength in a wavelength range of 300 nm to 450 nm is used. It is preferable that the sensitizer sensitizes the photopolymerization initiator using an electron-transfer mechanism or an energy-transfer mechanism.

Examples of the sensitizer include: a polynuclear aromatic compound such as phenanthrene, anthracene, pyrene, perylene, triphenylene, or 9,10-dialkoxyanthracene; a xanthene such as fluorescein, eosin, erythrosine, Rhodamine B, or Rose Bengal; a thioxanthone; a cyanine; a merocyanine; a phthalocyanine; a thiazine such as thionine, methylene blue, or toluidine blue; an acridine; an anthraquinone; a squarylium; a coumarin; a phenothiazine; a phenazine; a styrylbenzene; an azo compound; diphenylmethane; triphenylmethane; a distyrylbenzene; a carbazole; porphyrin; a spiro compound; quinacridone; indigo; styryl; a pyrylium compound; a pyrromethene compound; a pyrazolotriazole compound; a benzothiazole compound; a barbituric acid derivatives; a thiobarbituric acid derivatives; an aromatic ketone compound such as acetophenone, benzophenone, or Michler's ketone; and a heterocyclic compound such as N-aryloxazolidinone.

In addition, for example, a compound described in paragraphs "0101" to "0154" of JP2008-32803A can be used.

The content of the sensitizer in the coloring composition is preferably 0.1 to 20 mass % and more preferably 0.5 to 15 mass % in terms of solid content from the viewpoints of light absorption efficiency in a deep region and initiation decomposition efficiency.

Among the sensitizers, one kind may be used alone, or two or more kinds may be used in combination. In a case where two or more sensitizers are used in combination, it is preferable that the total content of the sensitizers is in the above-described range.

<<Chain Transfer Agent>>

Depending on the photopolymerization initiator used, it is preferable that a chain transfer agent is added to the coloring composition according to the present invention. Examples of the chain transfer agent include N,N-dialkylamino benzoic acid alkyl ester and a thiol compound, and examples of the thiol compound include 2-mercapto-benzothiazole, 2-mercapto-1-phenyl benzimidazole, and 3-mercaptopropionic acid. Among these chain transfers, one kind may be used alone, or a mixture of two or more kinds may be used.

<<Polymerization Inhibitor>>

The coloring composition according to the present invention may include a polymerization inhibitor in order to prevent unnecessary thermal polymerization of the polymerizable compound during the manufacturing or storage of the coloring composition.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxylamine cerium (III) salt. Among these, p-methoxyphenol is preferable.

The addition amount of the polymerization inhibitor is preferably 0.01 to 5 mass % with respect to the mass of the coloring composition.

<<Substrate Adhesive>>

The coloring composition according to the present invention may include a substrate adhesive in order to improve substrate adhesiveness.

As the substrate adhesive, a silane coupling agent, a titanate coupling agent, or an aluminum coupling agent can be preferably used. Examples of the silane coupling agent include γ-methacryloxypropyl trimethoxy silane, γ-methacryloxypropyl triethoxy silane, γ-acryloxypropyl trimethoxy silane, γ-acryloxypropyl triethoxy silane, γ-mercaptopropyl trimethoxy silane, γ-aminopropyl triethoxy silane, and phenyl trimethoxy silane. Among these, γ-methacryloxypropyl trimethoxy silane is preferable as the substrate adhesive.

From the viewpoint of preventing a residue from remaining in a non-exposed portion when the coloring composition is exposed and developed, the content of the substrate adhesive is preferably 0.1 to 30 mass %, more preferably 0.5 to 20 mass %, and still more preferably 1 to 10 mass % with respect to the total solid content of the coloring composition.

<<Surfactant>>

The coloring composition according to the present invention may include various surfactants from the viewpoint of further improving application properties. As the surfactants, various surfactants such as a fluorine surfactant, a nonionic surfactant, a cationic surfactant, an anionic surfactant, or a silicone surfactant can be used.

By the coloring composition containing a fluorine surfactant, liquid characteristics (for example, fluidity) of a coating solution prepared from the coloring composition are further improved, and the uniformity in coating thickness and liquid saving properties can be further improved. That is, in a case where a film is formed using a coating solution prepared using the coloring composition including a fluorine surfactant, the interfacial tension between a coated surface and the coating solution decreases, the wettability on the coated surface is improved, and the application properties on the coated surface is improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include: MEGAFAC F171, F172, F173, F176, F177, F141, F142, F143, F144, R30, F437, F475, F479, F482, F554, F780, and F781 (all of which are manufactured by DIC Corporation); FLUORAD FC430, FC431, and FC171 (all of which are manufactured by Sumitomo 3M Ltd.); and SURFLON S-382, SC-101, SC-103, SC-104, SC-105, SC-1068, SC-381, SC-383, S-393, and KH-40 (all of which are manufactured by Asahi Glass Co., Ltd.).

Specific examples of the nonionic surfactant include glycerol, trimethylolpropane, trimethylolethane, an ethoxylate and a propoxylate thereof (for example, glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.).

Specific examples of the cationic surfactant include a phthalocyanine derivative (trade name: EFKA-745, manufactured by Morishita Co., Ltd.), an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total mass of the coloring composition.

<<Other Components>>

The coloring composition according to the present invention optionally includes various additives including: a thermal polymerization initiator; a thermal polymerization component, an epoxy compound, or a plasticizer such as dioctyl phthalate; a developability improving agent such as a low molecular weight organic carboxylic acid; other fillers; an antioxidant; or an aggregation inhibitor.

<Preparation of Coloring Composition>

The coloring composition can be prepared by mixing the above-described respective components with each other.

During the preparation of the coloring composition, the respective components constituting the coloring composition may be mixed with each other collectively, or may be mixed with each other sequentially after dissolved or dispersed in a solvent. In addition, during mixing, the order of addition or working conditions are not particularly limited. For example, all the components may be dissolved or dispersed in a solvent at the same time to prepare the coloring composition. Optionally, two or more solutions or dispersions may be appropriately prepared using the respective components, and the solutions or dispersions may be mixed with each other during use (during application) to prepare the coloring composition.

It is preferable that, during the preparation, the coloring composition according to the present invention is filtered through a filter, for example, in order to remove foreign matter or to reduce defects.

As the filter, any filter which is used in the related art for filtering or the like can be used without any particular limitation.

Examples of a material of the filter include: a fluororesin such as polytetrafluoroethylene (PTFE); a polyamide resin such as nylon-6 or nylon-6,6; and a polyolefin resin (including a high-density polyolefin resin and an ultrahigh molecular weight polyolefin resin) such as polyethylene or polypropylene (PP). Among these materials, polypropylene (including high-density polypropylene) is preferable.

The pore diameter of the filter is not particularly limited and is, for example, preferably 0.01 to 7.0 μm, more preferably 0.01 to 2.5 μm, and still more preferably 0.01 to 2.0 μm. By adjusting the pore size of the filter to be in the above-described range, fine particles can be removed more effectively, and the turbidity of the coloring composition can be further reduced. Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation.

During filtering, two or more filters may be used in combination.

For example, first, filtering is performed using a first filter and then filtering is further performed using a second filter having a different pore size than the first filter.

At this time, the filtering using the first filter and the filtering using the second filter may be performed once, or twice or more, respectively.

The second filter may be formed of the same material as that of the first filter.

<Characteristics of Coloring Composition>

In the coloring composition according to the present invention, a viscosity at 25° C. is preferably 1 to 200 mPa·s, more preferably 50 to 200 mPa·s, and still more preferably 100 to 150 mPa·s.

In a case where a film (color filter) having a thickness of 0.1 to 2 μm is formed, the viscosity of the coloring composition at 25° C. is preferably 1 to 50 mPa·s, more preferably 1 to 20 mPa·s, and still more preferably 1 to 15 mPa·s.

In a case where a film (color filter) having a thickness of 2 to 20 μm is formed, the viscosity of the coloring composition at 25° C. is preferably 50 to 200 mPa·s, more preferably 50 to 150 mPa·s, and still more preferably 100 to 150 mPa·s.

The viscosity can be measured using, for example, a viscometer RE85L (manufactured by Toki Sangyo Co., Ltd.; rotor: 1°34'×R24; measurement range 0.6 to 1200 mPa·s) in a state where the temperature is adjusted to 25° C.

It is preferable that, when a film having a thickness of 12.0 μm after drying is formed using the coloring composition according to the present invention, a maximum value of a transmittance in a thickness direction of the film in a wavelength range of 400 to 780 nm is 15% or lower and a transmittance at a wavelength of 850 nm is 80% or higher. The maximum value of the transmittance in a wavelength range of 400 to 780 nm is preferably 15% or lower, more preferably 10% or lower, and still more preferably 5% or lower. The transmittance at a wavelength of 850 nm is preferably 80% or higher, more preferably 85% or higher, and still more preferably 90% or higher. In addition, the minimum value of the transmittance in a wavelength range of 850 to 1300 nm is preferably 80% or higher, more preferably 85% or higher, and still more preferably 90% or higher.

<Film>

Next, a film according to an aspect to of the present invention will be described.

The film is formed by curing the above-described coloring composition according to the present invention. The formed film is preferably used in a color filter.

In the film, it is preferable that a light transmittance in a thickness direction of the film has a maximum value of 15% or lower in a wavelength range of 400 to 780 nm and has a minimum value of 80% or higher in a wavelength range of 850 to 1300 nm. Due to these spectral characteristics, the film can allow transmission of near infrared rays in a state where noise generated from visible rays is small.

The spectral characteristics of the film are values obtained by measuring the transmittance in a wavelength range of 300 to 1300 nm using a spectrophotometer (ref. the glass substrate) of an ultraviolet-visible-near infrared spectrophotometer (U-4100, manufactured by Hitachi High-Technologies Corporation).

The thickness of the film is not particularly limited and is preferably 0.1 to 20 μm, more preferably 0.5 to 15 μm, and still more preferably 3 to 15 μm. Regarding the film having the above-described spectral characteristics, as the thickness of the film increases, a surface of the film is more likely to be corrugated. However, according to the present invention, even in a case where the thickness of the film is large, corrugation can be suppressed. Therefore, in a case where the thickness of a film is large, the effects of the present invention are significant.

<Pattern Forming Method, Color Filter, and Method of Manufacturing Color Filter>

Next, a pattern forming method and a color filter according to aspects of the present invention will be described in detail using a manufacturing method thereof. In addition, a method of manufacturing a color filter according to an aspect of the present invention in which the pattern forming method is used will also be described.

The pattern forming method includes: a step of applying the coloring composition to a support to form a coloring composition layer; a step of exposing the coloring composition layer in a pattern shape; and a step of forming a colored pattern by removing a non-exposed portion by development. This pattern forming method is used for manufacturing a colored layer of a color filter. That is, this specification also discloses the method of manufacturing a color filter including the pattern forming method.

Hereinafter, each step of the pattern forming method will be described in detail through the method of manufacturing a color filter for a solid image pickup element. However, the present invention is not limited to this method. Hereinafter, the color filter for a solid image pickup element will be referred to simply as "color filter".

<<Step of Forming Coloring Composition Layer>>

In the step of forming a coloring composition layer, the coloring composition according to the present invention is applied to a support to form a coloring composition layer thereon.

Examples of the support include: a substrate for a solid image pickup element obtained by providing an image pickup element (light receiving element) such as CCD or CMOS on a substrate (for example, a silicon substrate), a silicon substrate, a non-alkali glass substrate, a soda glass substrate, a PYREX (registered trade name) glass substrate, or a quartz glass substrate; and a substrate obtained by attaching a transparent conductive film to the above-described substrate. In these substrates, a black matrix may be formed to separate pixels from each other.

In addition, optionally, an undercoat layer may be provided on the support to improve adhesion with a layer above the support, to prevent diffusion of materials, or to make a surface of the substrate flat.

Examples of a method of applying the coloring composition according to the present invention to the support include various coating methods such as slit coating, an ink jet method, spin coating, cast coating, roll coating, or screen printing method.

The coloring composition layer applied to the support can be dried (pre-baked) using, for example, a hot plate or an oven at a temperature of 50° C. to 140° C. for 10 to 300 seconds.

The thickness of the dried (pre-baked) coloring composition layer is preferably 0.55 to 30 μm, more preferably 0.60 to 25 μm, still more preferably 0.70 to 20 μm, and even still more preferably 0.80 μm to 15 μm.

<<Exposure Step>>

In the exposure step, the coloring composition layer is exposed in a pattern shape using an exposure device such as a stepper through a mask having a predetermined mask pattern. As a result, a cured film is obtained.

As radiation (light) used during the exposure, in particular, ultraviolet rays such as g-rays or i-rays are preferably used, and i-rays are more preferably used. The irradiation intensity (exposure intensity) is preferably 30 to 1500 mJ/cm$^2$, more preferably 50 to 1000 mJ/cm$^2$, and still more preferably 80 to 500 mJ/cm$^2$.

<<Development Step>>

After the exposure step, a development step is performed such that a non-cured portion after exposure is eluted into a developer and a photo-cured portion remains. Through this development step, a colored pattern can be formed.

The development method may be any one of a dipping method, a shower method, a spray method, and a puddle method which may be used in combination with a swing method, a spin method, an ultrasonic method, or the like.

Before contact with the developer, a surface to be developed can be wetted with water or the like in advance to prevent unevenness in development.

As the developer, an organic alkali developer which does not cause damages to an undercoat circuit or the like is desired. The developing temperature is preferably 20° C. to 30° C. The developing time is preferably 20 to 90 seconds.

It is preferable that the developer includes an alkaline agent. Examples of an alkaline agent include: an organic alkaline compound such as ammonia water, ethylamine, diethylamine, dimethylethanolamine, tetramethylammonium hydroxide, tetraethylammonium hydroxide, tetrabutylammonium hydroxide, benzyltrimethylammonium hydroxide, choline, pyrrole, piperidine, or 1,8-diazabicyclo-[5,4,0]-7-undecene; and an inorganic compound such as sodium hydroxide, potassium hydroxide, sodium bicarbonate, or potassium bicarbonate.

As the developer, an alkaline aqueous solution is preferably used in which the above alkaline agent is diluted with pure water such that a concentration thereof is 0.001 to 10 mass % and preferably 0.01 to 1 mass %. In a case where a developer including the alkaline aqueous solution is used, in general, it is preferable that the film is rinsed with pure water to remove a residual developer after development and dried.

After the exposure step and the drying, a heat treatment (post-baking) or a curing step of curing the film by post-exposure may be performed. Post-baking is a heat treatment which is performed after development to completely cure the film, in which a thermal curing treatment is performed typically at 100° C. to 270° C.

The film after the development is post-baked continuously or batchwise using heating means such as a hot plate, a convection oven (hot air circulation dryer), a high-frequency heater under the above-described conditions.

In a case where light is used for post-baking, for example, g-rays, h-rays, i-rays, excimer laser such as KrF or ArF, electron rays, or X-rays can be used. It is preferable that post-baking is performed using an existing high-pressure mercury lamp at a low temperature of about 20° C. to 50° C. The irradiation time is 10 to 180 seconds and preferably 30 to 60 seconds. In a case where post-exposure and post-heating are performed in combination, it is preferable that post-exposure is performed before post-heating.

By performing the above-described respective steps, a color filter is prepared.

The color filter may consist of only colored pixels in which the film having the above-described specific spectral characteristics is used, or may include not only the colored pixels in which the film having the above-described specific spectral characteristics is used but also colored pixels of red, green, blue, magenta, yellow, cyan, black, or transparent color. In a case where the color filter includes not only the colored pixels in which the film having the specific spectral characteristics is used but also other color pixels, the colored pixels in which the film having the specific spectral characteristics is used may be provided before or after the other color pixels.

In a case where the coloring composition according to the present invention is attached to a nozzle of an ejecting unit of a coater, a pipe of a coater, or an inside portion of a coater, the coloring composition be easily removed by rinsing with a well-known cleaning solution. In addition, in order to improve the permeability of the cleaning solution into the coloring composition, the surfactant described above as the surfactant which may be included in the coloring composition may be added to the cleaning solution.

This color filter can be suitably mounted on a solid image pickup element such as a CCD image sensor, a CMOS image sensor, an organic CMOS image sensor, or a CIGS image sensor. In particular, it is preferable that the color filter is mounted on a high-resolution solid image pickup element including more than 1000000 pixels. For example, the color filter can be disposed between a light receiving section of each of pixels constituting a CCD image sensor and a microlens for collecting light.

<Solid Image Pickup Element>

A solid image pickup element according to an aspect of the present invention includes the color filter for a solid image pickup element. The solid image pickup element is configured to include the color filter according to the aspect of the present invention as a color filter for a solid image pickup element. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protection film formed of silicon nitride or the like is formed on the light shielding film so as to cover the entire surface of the light shielding film and the light receiving sections of the photodiodes, and the color filter for a solid image pickup element is formed on the device protection film.

Further, a configuration in which light collecting means (for example, a microlens; hereinafter, the same shall be applied) is provided above the device protection film and below the color filter for a solid image pickup element (on a side thereof close the support), or a configuration in which light collecting means is provided on the color filter may be adopted.

<Infrared Sensor>

An infrared sensor according to an aspect of the present invention includes the color filter. The infrared sensor is configured to include the color filter according to the aspect of the present invention. The configuration of the infrared sensor is not particularly limited as long as the infrared sensor functions. For example, the following configuration can be adopted.

The infrared sensor includes plural photodiodes and transfer electrodes on a substrate, the photodiodes constituting a light receiving area of a solid image pickup element (for example, a CCD image sensor, a CMOS image sensor, or an organic CMOS sensor), and the transfer electrode being formed of polysilicon or the like. In the infrared sensor, a light shielding film formed of tungsten or the like which has openings through only light receiving sections of the photodiodes is provided on the photodiodes and the transfer electrodes, a device protection film formed of silicon nitride or the like is formed on the light shielding film so as to cover the entire surface of the light shielding film and the light receiving sections of the photodiodes, and the color filter is formed on the device protection film.

Further, a configuration in which light collecting means (for example, a microlens; hereinafter, the same shall be applied) is provided above the device protection film and below the color filter (on a side thereof close the substrate), or a configuration in which light collecting means is provided on the color filter may be adopted.

An organic CMOS sensor has a two-layer hybrid structure including: a thin panchromatic organic photoelectric conversion film which is a photoelectric conversion layer; and a CMOS signal read-out substrate, in which an organic material serves to trap light and to convert the trapped light to an electric signal, and an inorganic material serves to extract the electric signal to the outside. In this structure, the aperture ratio can be set as 100% with respect to incidence rays in principle. The organic photoelectric conversion film is a structure-free continuous film, and can be provided on the CMOS signal read-out substrate. Therefore, the organic photoelectric conversion film does not require an expensive microfabrication process and is suitable for reducing the pixel size.

Hereinafter, an embodiment of the infrared sensor will be described using FIG. 1.

As shown in FIG. 1, an infrared sensor 100 includes a solid image pickup element 110.

In an imaging region provided on the solid image pickup element 110, near infrared absorbing filters 111 and color filters 112 are provided.

The near infrared absorbing filters 111 are configured to allow transmission of light in the visible region (for example light having a wavelength of 300 to 700 nm) and to shield light in the infrared region (for example, light having a wavelength of 800 to 1300 nm, preferably light having a wavelength of 900 to 1300 nm, and more preferably light having a wavelength of 1000 to 1300 nm).

In the color filters 112, pixels which allow transmission of light having a specific wavelength in the visible region and absorbs the light. For example, pixels of red (R), green (G), and blue (B) are formed in the color filters 112.

Regions 114 where the near infrared absorbing filters 111 are not formed are provided between near infrared transmitting filters 113 and the solid image pickup element 110. In the regions 114, resin layers (for example, transparent resin layers) capable of allowing transmission of light having a wavelength which has passed through the near infrared transmitting filters 113 are disposed.

The near infrared transmitting filters 113 have visible ray shielding properties, allow transmission of infrared rays having a specific wavelength, and are formed of the above-described color filter having the specific spectral characteristics. For example, it is preferable that the near infrared transmitting filters 113 shield light having a wavelength of 400 to 780 nm and allow transmission of light having a wavelength of 850 to 1300 nm.

Microlenses 115 are disposed on incidence rays hv side of the color filters 112 and the near infrared transmitting filters 113. A planarizing layer 116 is formed so as to cover the microlenses 115.

In the embodiment shown in FIG. 1, the resin layers are disposed in the regions 114. However, the near infrared transmitting filters 113 may be formed in the regions 114. That is, the near infrared transmitting filters 113 may be formed on the solid image pickup element 110.

In addition, in the embodiment shown in FIG. 1, the thickness of the color filters 112 is the same as the thickness of the near infrared transmitting filters 113. However, the thickness of the color filters 112 may be different from the thickness of the near infrared transmitting filters 113.

In addition, in the embodiment shown in FIG. 1, the color filters 112 are provided on the incidence rays hv side compared to the near infrared absorbing filters 111. The lamination order of the near infrared absorbing filters 111 and the color filters 112 may be reversed, and the near infrared absorbing filters 111 may be provided on the incidence rays hv side compared to the color filters 112.

In addition, in the embodiment shown in FIG. 1, the near infrared absorbing filters 111 and the color filters 112 are laminated adjacent to each other. However, the near infrared absorbing filters 111 and the color filters 112 are not necessarily provided adjacent to each other, and another layer may be provided therebetween.

According to this infrared sensor, image information can be acquired at the same time. Therefore, the infrared sensor can be used for motion sensing in a case where a motion detecting target is recognized. Further, since distance information can be acquired, for example, an image including 3D information can be obtained.

Next, an imaging apparatus will be described as an example to which the infrared sensor is applied. Examples of the imaging apparatus include a camera module.

Figure 2:
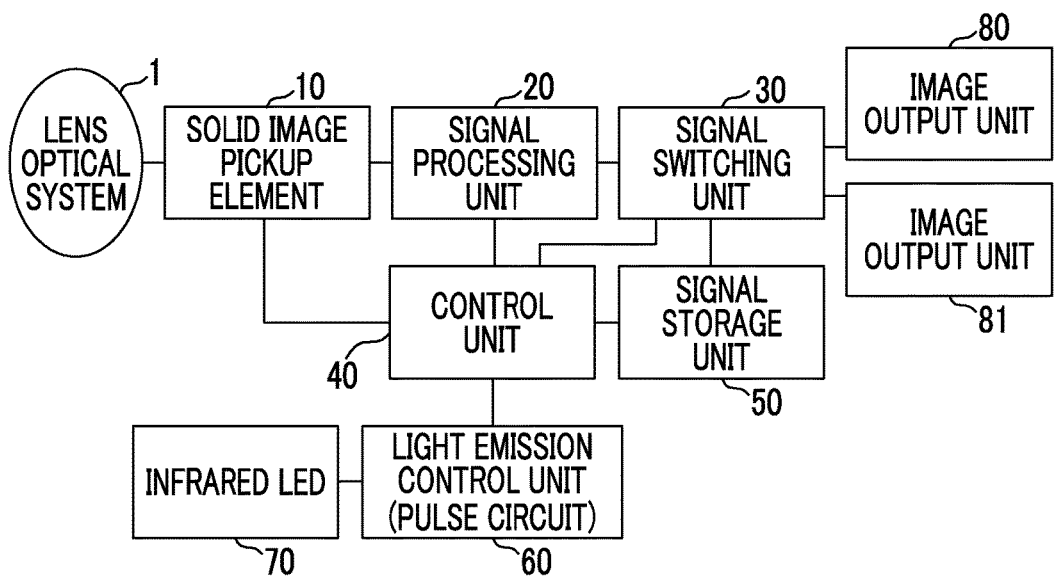
FIG. 2 is a functional block diagram showing an imaging apparatus to which the infrared sensor is applied.

FIG. 2 is a functional block diagram showing the imaging apparatus. The imaging apparatus includes a lens optical system 1, a solid image pickup element 10, a signal processing unit 20, a signal switching unit 30, a control unit 40, a signal storage unit 50, a light emission control unit 60, an infrared LED 70 of a light emitting element which emits infrared rays, and image output units 80 and 81. As the solid image pickup element 10, the above-described infrared sensor 100 can be used. In addition, a part or all of other components of the imaging apparatus excluding the solid image pickup element 10 and the lens optical system 1 may be formed on the same semiconductor substrate. The respective configurations of the imaging apparatus can be found in paragraphs "0032" to "0036" of JP2011-233983A, the content of which is incorporated herein by reference.

EXAMPLES

Hereinafter, the present invention will be described in more detail using examples. However, the present invention is not limited to the following examples as long as it does not depart from the scope of the present invention. Unless specified otherwise, "part(s)" and "%" represent "part(s) by mass" and "mass %".

[Preparation of Pigment Dispersion B-1]

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion B-1 was prepared.

| | |
|---|---|
| Mixed pigment including a red pigment (C.I. Pigment Red 254) and a yellow pigment (C.I. Pigment Yellow 139) | 14.8 parts |
| Dispersant: BYK-111 (manufactured by BYK) | 6.8 parts |
| Organic Solvent: propylene glycol methyl ether acetate (PGMEA) | 78.4 parts |

[Preparation of Pigment Dispersion B-2]

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion B-2 was prepared.

| | |
|---|---|
| Mixed pigment including a blue pigment (C.I. Pigment Blue 15:6) and a violet pigment (C.I. Pigment Violet 23) | 12.8 parts |
| Dispersant: BYK-111 (manufactured by BYK) | 2.0 parts |
| Alkali-Soluble Resin 1 | 3.2 parts |
| Organic solvent: cyclohexanone | 31.0 parts |
| Organic solvent: PGMEA | 51.0 parts |

Example 1

[Preparation of Coloring Composition]

A coloring composition according to Example 1 was prepared by mixing the following components with each other.

| | |
|---|---|
| Pigment Dispersion B-1 (mass ratios of the respective pigments are shown in Table 1 below) | 11.2 parts |
| Pigment Dispersion B-2 (mass ratios of the respective pigments are shown in Table 1 below) | 9.1 parts |
| 40 mass % PGMEA solution of the following Alkali-Soluble Resin 1 | 54.2 parts |
| The following Polymerizable Compound 1 | 13.6 parts |
| The following Photopolymerization Initiator 1 | 2.0 parts |
| Surfactant 1: 10 mass % of PGMEA solution of MEGAFAC F-781F (manufactured by DIC Corporation) | 0.42 parts |
| The following Ultraviolet Absorber 1 | 0.41 parts |
| Polymerization Inhibitor: p-methoxyphenol | 0.01 parts |
| Organic solvent 1: PGMEA | 9.2 parts |

Examples 2 to 8 and Comparative Examples 1 to 4

Coloring composition according to Examples 2 to 8 and Comparative Examples 1 to 4 were prepared using the same method as the method of preparing the coloring composition according to Example 1, except that the kinds and amounts (part(s) by mass) of the pigment dispersion, the alkali-soluble resin, the polymerizable compound, the photopolymerization initiator, and the organic solvent are changed as shown in Table 2 below (mass ratios of the respective pigments in the pigment dispersion are shown in Table 1; and no numerical value in Table 2 represents that the component was not used).

TABLE 1

|  | Red Pigment Ratio | Yellow Pigment Ratio | Blue Pigment Ratio | Violet Pigment Ratio |
| --- | --- | --- | --- | --- |
| Example 1 | 38 | 16 | 37 | 9 |
| Example 2 | 38 | 16 | 37 | 9 |
| Example 3 | 38 | 16 | 37 | 9 |
| Example 4 | 38 | 16 | 37 | 9 |
| Example 5 | 38 | 16 | 37 | 9 |
| Example 6 | 38 | 16 | 37 | 9 |
| Example 7 | 38 | 16 | 37 | 9 |
| Example 8 | 38 | 16 | 37 | 9 |
| Comparative Example 1 | 38 | 16 | 37 | 9 |
| Comparative Example 2 | 38 | 16 | 37 | 9 |
| Comparative Example 3 | 38 | 16 | 37 | 9 |
| Comparative Example 4 | 38 | 16 | 37 | 9 |

The ratios of the respective pigments shown in Table 1 are ratios (by mass) of the respective pigments to the total mass of all the pigments.

TABLE 2

|  | Example 1 | Example 2 | Example 3 | Example 4 | Example 5 | Example 6 | Example 7 | Example 8 | Comparative Example 1 | Comparative Example 2 | Comparative Example 3 | Comparative Example 4 |
| --- | --- | --- | --- | --- | --- | --- | --- | --- | --- | --- | --- | --- |
| Pigment Dispersion B-1 | 11.2 | 11.2 | 11.2 | 11.2 | 11.2 | 3.7 | 11.2 | 11.2 | 18.6 | 1.86 | 11.2 | 11.2 |
| Pigment Dispersion B-2 | 9.1 | 9.1 | 9.1 | 9.1 | 9.1 | 3 | 9.1 | 9.1 | 15.2 | 1.52 | 9.1 | 9.1 |
| Alkali-Soluble Resin 1 | 54.2 | 61.8 | 17.9 | 54.2 | 54.2 | 57.7 | 54.2 | 27.1 | 52 | 59 | 67.4 | 10.6 |
| Alkali-Soluble Resin 2 |  |  |  |  |  |  |  | 27.1 |  |  |  |  |
| Polymerizable Compound 1 | 13.6 | 10.5 | 25.8 |  |  | 14.2 | 13.6 | 13.6 | 11.6 | 14.3 | 8.5 | 28.4 |
| Polymerizable Compound 2 |  |  |  | 13.6 |  |  |  |  |  |  |  |  |
| Polymerizable Compound 3 |  |  |  |  | 13.6 |  |  |  |  |  |  |  |
| Photopolymerization Initiator 1 | 2 | 1.5 | 3.7 | 2 | 2 | 2 |  | 2 | 1.7 | 2.1 | 1.2 | 4.1 |
| Photopolymerization Initiator 2 |  |  |  |  |  |  | 2 |  |  |  |  |  |
| Surfactant 1 | 0.42 | 0.42 | 0.42 | 0.42 | 0.42 | 0.42 | 0.42 | 0.42 | 0.42 | 0.42 | 0.42 | 0.42 |
| Ultraviolet Absorber 1 | 0.41 | 0.41 | 0.41 | 0.41 | 0.41 | 0.41 | 0.41 | 0.41 | 0.41 | 0.41 | 0.41 | 0.41 |
| Polymerization Inhibitor | 0.01 | 0.01 | 0.01 | 0.01 | 0.01 | 0.01 | 0.01 | 0.01 | 0.01 | 0.01 | 0.01 | 0.01 |
| Organic Solvent 1 | 9.2 | 5.12 | 31.46 | 9.2 | 9.2 | 18.6 | 9.2 | 9.2 | 0.1 | 20.5 | 1.78 | 35.9 |

In Table 2, the amount of Alkali-Soluble Resin 1 was a value (part(s) by mass) measured in the 40 mass % PGMEA solution. In addition, the amount of Alkali-Soluble Resin 2 was a value (part(s) by mass) measured in the 40 mass % PGMEA solution. In addition, the amount of Surfactant 1 was a value (part(s) by mass) measured in the 10 mass % PGMEA solution.

In Table 2, an abbreviation of each component is as follows.

Alkali-Soluble Resin 1: the following structure (a ratio of a repeating unit is a molar ratio)

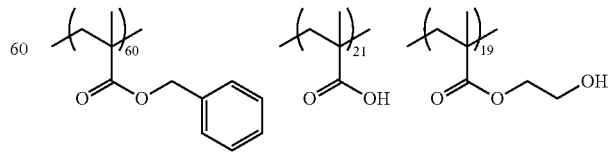

Alkali-Soluble Resin 2: the following structure (a ratio of a repeating unit is a molar ratio)

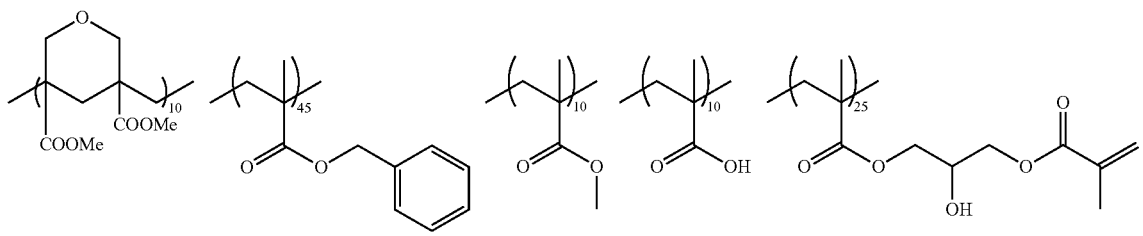

Polymerizable Compound 1: the following structure (UA-7200, manufactured by Shin-Nakamura Chemical Co., Ltd., (molecular weight/number of polymerizable groups)=290)

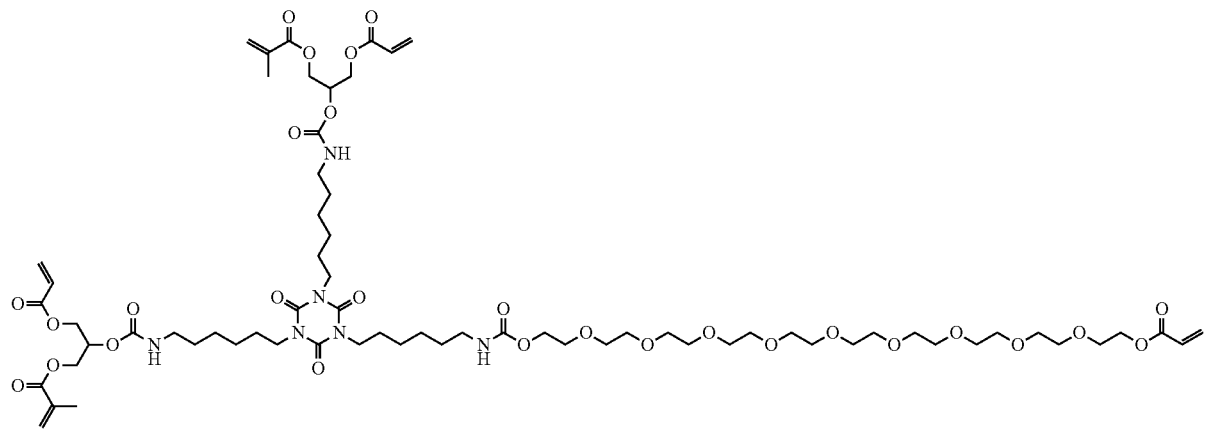 [SMILES: C=CC(=O)OCCOCCOCCOCCOCCOCCOCCOCCOCCOCCOC(=O)NCCCCCCn1c(=O)n(CCCCCCNC(=O)OC(COC(=O)C=C)COC(=O)C(=C)C)c(=O)n(CCCCCCNC(=O)OC(COC(=O)C=C)COC(=O)C(=C)C)c1=O]

Polymerizable Compound 2: the following structure (KAYARAD RP-1040, manufactured by Nippon Kayaku Co., Ltd., (molecular weight/number of polymerizable groups)=470)

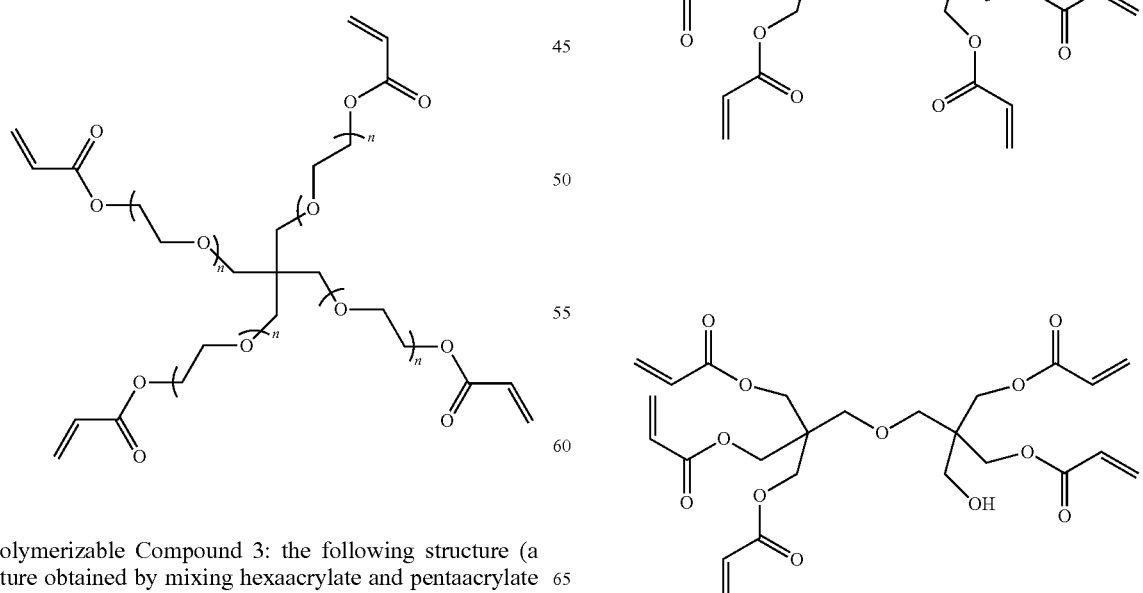

Polymerizable Compound 3: the following structure (a mixture obtained by mixing hexaacrylate and pentaacrylate with each other at a mass ratio of 7:3, (molecular weight/number of polymerizable groups)=99)

Photopolymerization Initiator 1: the following structure

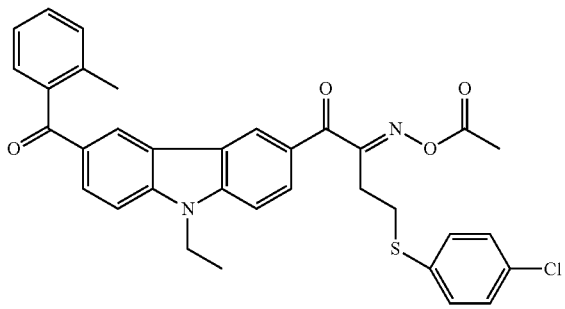 [SMILES: CCn1c2ccc(C(=O)/C(CCSc3ccc(Cl)cc3)=N/OC(C)=O)cc2c2cc(C(=O)c3ccccc3C)ccc21]

Photopolymerization Initiator 2: the following structure

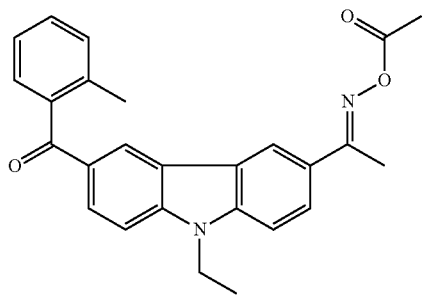 [SMILES: CCn1c2ccc(C(=O)c3ccccc3C)cc2c2cc(/C(C)=N/OC(C)=O)ccc21]

Ultraviolet Absorber 1: the following structure

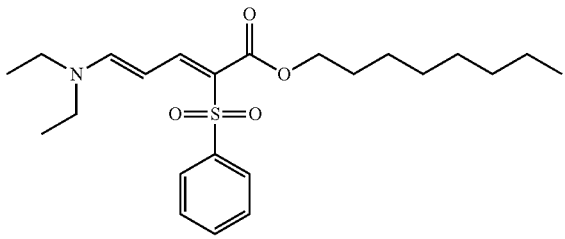 [SMILES: CCCCCCCCOC(=O)/C(=C/C=C/N(CC)CC)S(=O)(=O)c1ccccc1]

[Measurement of Absorbance and Transmittance]

The coloring composition was applied to a glass substrate such that the thickness of a post-baked film was 12 μm to form a colored layer on the glass substrate. Specifically, the coloring composition was spin-coated on the glass substrate, was dried using a hot plate at 100° C. for 120 seconds, and then was further heated (post-baked) using a hot plate at 200° C. for 300 seconds.

Regarding the glass substrate including the colored layer, using a ultraviolet-visible-near infrared spectrophotometer U-4100 (manufactured by Hitachi High-Technologies Corporation; ref. glass substrate), the minimum value A of the absorbance in a wavelength range of 400 nm or longer and shorter than 580 nm, the minimum value B of the absorbance in a wavelength range of 580 nm to 770 nm, the minimum value C of the absorbance in a wavelength range of 400 nm to 750 nm, the maximum value D of the absorbance in a wavelength range of 850 nm to 1300 nm, the minimum value of the transmittance in a wavelength range of 400 to 780 nm, and the transmittance at a wavelength of 850 nm were measured.

[Measurement of Viscosity]

A viscosity of the coloring composition at 25° C. was measured using a B-type viscometer (manufactured by Toki Sangyo Co., Ltd.).

[Preparation of Color Filter]

Each of the coloring compositions was applied to a silicon wafer using a spin coater such that the thickness of a dried film was 12 μm, and was heated (pre-baked) using a hot plate at 100° C. for 120 seconds to form a coating film.

Next, using an i-ray stepper exposure device FPA-3000 i5+(manufactured by Canon Corporation), the coating film was exposed at an optimum exposure intensity through a photomask on which a square pixel pattern having a size of 1.4×1.4 μm was formed. The optimum exposure intensity was determined based on an exposure intensity at which the square pixel pattern is resolved while increasing the intensity from 50 to 750 mJ/cm$^2$ at an interval of 50 mJ/cm$^2$.

Next, the silicon wafer on which the exposed coating film was formed was placed on a horizontal rotary table of a spin-shower developing machine (DW-30, manufactured by Chemitronics Co., Ltd.) and underwent paddle development at 23° C. for 60 seconds using CD-2060 (manufactured by Fujifilm Electronic Materials Co., Ltd.) to form a colored pattern on the silicon wafer.

The silicon wafer on which the colored pattern was formed was rinsed with pure water and was dried by spraying.

Further, the silicon wafer was heated (post-baked) using a hot plate at 200° C. for 300 seconds. In this way, silicon wafers having the colored pattern were obtained as color filters according to Examples 1 to 8 and Comparative Examples 1 to 4.

<Evaluation>

[Noise]

A ratio (t1/t2) of an average transmittance t1 in the visible region (wavelength of 400 to 700 nm) to an average transmittance t2 in a wavelength range of 825 to 1300 nm was obtained to evaluate noise based on the following evaluation criteria. The lower the value of t1/t2, the smaller the noise generated from visible rays in the color filter.

3: t1/t2 was lower than 0.085
2: t1/t2 was 0.085 or higher and lower than 0.1
1: t1/t2 was 0.1 or higher

[Corrugation]

A surface of the color filter was measured using an atomic force microscope (AFM), and a surface roughness (Ra) was obtained by calculation.

3: the surface roughness (Ra) was lower than 10 nm
2: the surface roughness (Ra) was 10 nm or higher and lower than 20 nm
1: the surface roughness (Ra) was 20 nm or higher

[Residue]

After applying and developing the color filter on the glass substrate, the transmittance of a non-exposed portion was measured using a spectrophotometer, and a spectroscopic variation between the transmittances of the glass substrate before and after the formation of the coating film caused by a development residue was evaluated. The variation was measured at a position of the measured region, where the maximum variation can be obtained, and at a wavelength of the visible region (wavelength region of 400 to 700 nm) where the maximum variation can be obtained.

3: the variation between the transmittances was lower than 1%
2: the variation between the transmittances was 1% or higher and lower than 5%

1: the variation between the transmittances was 5% or higher

[Adhesiveness]

During the preparation of the color filter, a state of the coating film after development was observed with an optical microscope, and the number of square pixel patterns peeled was counted.

3: no patterns peeled were observed
2: the number of patterns peeled was less than 10
1: the number of patterns peeled was 10 or more

EXPLANATION OF REFERENCES

1: lens optical system
10: solid image pickup element
20: signal processing unit
30: signal switching unit
40: control unit
50: signal storage unit
60: light emission control unit
70: infrared LED

TABLE 3

|  | Viscosity (mP·s) | Maximum Value of Transmittance (400 to 780 nm) | Transmittance (850 nm) | Minimum Value A of Absorbance | Minimum Value B of Absorbance | Minimum Value C of Absorbance | Maximum Value D of Absorbance | Absorbance Ratio (A/B) | Absorbance Ratio (C/D) |
|---|---|---|---|---|---|---|---|---|---|
| Example 1 | 130 | 27 | 98 | 0.82 | 0.50 | 0.57 | 0.01 | 1.6 | 65 |
| Example 2 | 140 | 27 | 98 | 0.82 | 0.50 | 0.57 | 0.01 | 1.6 | 65 |
| Example 3 | 140 | 27 | 98 | 0.82 | 0.50 | 0.57 | 0.01 | 1.6 | 65 |
| Example 4 | 130 | 27 | 98 | 0.82 | 0.50 | 0.57 | 0.01 | 1.6 | 65 |
| Example 5 | 130 | 27 | 98 | 0.82 | 0.50 | 0.57 | 0.01 | 1.6 | 65 |
| Example 6 | 130 | 65 | 99 | 0.27 | 0.16 | 0.19 | 0.00 | 1.7 | 54 |
| Example 7 | 130 | 27 | 98 | 0.82 | 0.50 | 0.57 | 0.01 | 1.6 | 65 |
| Example 8 | 140 | 27 | 98 | 0.82 | 0.50 | 0.57 | 0.01 | 1.6 | 65 |
| Comparative Example 1 | 120 | 11 | 96 | 1.37 | 0.84 | 0.94 | 0.02 | 1.6 | 47 |
| Comparative Example 2 | 130 | 80 | 100 | 0.14 | 0.08 | 0.09 | 0.0017 | 1.7 | 53 |
| Comparative Example 3 | 140 | 27 | 98 | 0.82 | 0.50 | 0.57 | 0.01 | 1.6 | 65 |
| Comparative Example 4 | 100 | 27 | 98 | 0.82 | 0.50 | 0.57 | 0.01 | 1.6 | 65 |

TABLE 4

|  | Noise | Corrugation | Residue | Adhesiveness | Content of Polymerizable Compounds (mass %) | Colorants/ Polymerizable Compounds (mass ratio) | Polymerizable Compounds/ Resin (mass ratio) |
|---|---|---|---|---|---|---|---|
| Example 1 | 3 | 3 | 3 | 3 | 33 | 0.21 | 0.6 |
| Example 2 | 3 | 2 | 3 | 2 | 26 | 0.27 | 0.4 |
| Example 3 | 3 | 3 | 2 | 3 | 64 | 0.11 | 3.0 |
| Example 4 | 3 | 2 | 3 | 2 | 33 | 0.21 | 0.6 |
| Example 5 | 3 | 2 | 3 | 2 | 33 | 0.21 | 0.6 |
| Example 6 | 2 | 3 | 2 | 3 | 35 | 0.07 | 0.6 |
| Example 7 | 3 | 3 | 3 | 2 | 33 | 0.21 | 0.6 |
| Example 8 | 3 | 3 | 3 | 3 | 33 | 0.21 | 0.6 |
| Comparative Example 1 | 3 | 1 | 3 | 3 | 29 | 0.41 | 0.5 |
| Comparative Example 2 | 1 | 3 | 2 | 3 | 35 | 0.03 | 0.6 |
| Comparative Example 3 | 3 | 1 | 3 | 1 | 21 | 0.33 | 0.3 |
| Comparative Example 4 | 3 | 1 | 1 | 3 | 70 | 0.10 | 5.0 |

In all of the Examples 1 to 8 in which the coloring composition according to the example of the present invention was used, a film capable of allowing transmission of near infrared rays and suppressing corrugation in a state where noise generated from visible rays was small was able to be formed. In addition, in Examples 1 to 8, the amount of a residue was small, and adhesiveness was excellent.

On the other hand, in Comparative Examples 1, 3, and 4, a surface of the film was corrugated significantly. In addition, in Comparative Example 2, the noise was large.

80, 81: image output unit
100: infrared sensor
110: solid image pickup element
111: near infrared absorbing filter
112: color filter
113: near infrared transmitting filter
114: region
115: microlens
116: planarizing layer
hv: incidence rays

What is claimed is:

1. A coloring composition comprising:
colorants that are at least one selected from the group consisting of yellow colorants, blue colorants, red colorants, and violet colorants;
polymerizable compounds; and
a resin,
wherein a ratio P/M of a total mass P of the colorants to a mass M of the polymerizable compounds is 0.05 to 0.35,
a content of the polymerizable compounds is 25 to 65 mass % with respect to a total solid content of the coloring composition,
a ratio A/B of a minimum value A of an absorbance in a wavelength range of 400 nm or longer and shorter than 580 nm to a minimum value B of an absorbance in a wavelength range of 580 nm to 770 nm is 0.3 to 3,
a ratio C/D of a minimum value C of an absorbance in a wavelength range of 400 nm to 750 nm to a maximum value D of an absorbance in a wavelength range of 850 nm to 1300 nm is 5 or higher,
the colorants include a yellow colorant, a blue colorant, a red colorant, and a violet colorant,
a ratio (red colorant/all the colorants) of the mass of the red colorant to the total mass of the colorants is 0.1 to 0.5,
a ratio (yellow colorant/all the colorants) of the mass of the yellow colorant to the total mass of the colorants is 0.1 to 0.4,
a ratio (blue colorant/all the colorants) of the mass of the blue colorant to the total mass of the colorants is 0.2 to 0.6, and
a ratio (violet colorant/all the colorants) of the mass of the violet colorant to the total mass of the colorants is 0.01 to 0.3.

2. The coloring composition according to claim 1,
wherein a ratio M/B of the mass M of the polymerizable compounds to a mass B of the resin is 0.4 to 3.0.

3. The coloring composition according to claim 1,
wherein the colorants include a blue pigment, a red pigment, a yellow pigment, and a violet pigment.

4. The coloring composition according to claim 1,
wherein the polymerizable compounds include a polymerizable compound which has an alkyleneoxy chain including two or more alkyleneoxy groups as a repeating unit.

5. The coloring composition according to claim 1,
wherein a value obtained by dividing a value of a molecular weight of each of the polymerizable compounds by the number of polymerizable groups in the polymerizable compound is 100 to 300.

6. The coloring composition according to claim 1,
wherein when a film having a thickness of 12.0 µm after drying is formed, a maximum value of a transmittance of the film in a wavelength range of 400 to 780 nm is 15% or lower and a transmittance of the film at a wavelength of 850 nm is 80% or higher.

7. The coloring composition according to claim 1,
wherein a viscosity at 25° C. is 100 to 150 mP·s.

8. A film which is formed by curing the coloring composition according to claim 1.

9. A color filter comprising:
the film according to claim 8.

10. A solid image pickup element comprising:
the color filter according to claim 9.

11. An infrared sensor comprising:
the color filter according to claim 9.

12. A pattern forming method comprising:
applying the coloring composition according to claim 1 to a support to form a coloring composition layer;
exposing the coloring composition layer in a pattern shape; and
forming a colored pattern by removing a non-exposed portion by development.

13. A method of manufacturing a color filter comprising:
the pattern forming method according to claim 12.

14. The coloring composition according to claim 1,
wherein the polymerizable compounds include a compound having a partial structure represented by the following Formula (1),

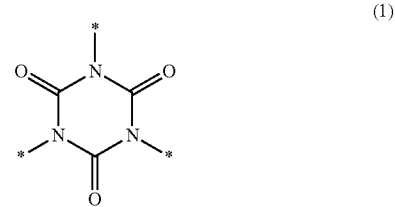 [SMILES: *n1c(=O)n(*)c(=O)n(*)c1=O]

wherein in Formula (1), * represents a direct bond.

15. The coloring composition according to claim 1,
wherein the polymerizable compounds consist of compounds having a partial structure represented by the following Formula (1),

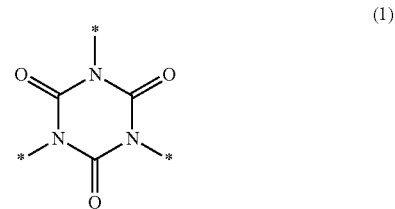 [SMILES: *n1c(=O)n(*)c(=O)n(*)c1=O]

wherein in Formula (1), * represents a direct bond.

16. The coloring composition according to claim 1, wherein the colorants comprise one or more of the following pigments: C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214; C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279; C.I. Pigment Blue 1, 2, 15, 15:1, 15:2, 15:3, 15:4, 15:6, 16, 22, 60, 64, 66, 79, and 80.

17. The coloring composition according to claim 1, further comprising one or more of the following pigments: carbon black; titanium black; an oxide of iron, cobalt, aluminum, cadmium, lead, copper, titanium, magnesium, chromium, zinc, or antimony; or a composite oxide of iron, cobalt, aluminum, cadmium, lead, copper, titanium, magnesium, chromium, zinc, or antimony.

18. The coloring composition according to claim 1, further comprising one or more of the following dyes: a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, a pyrromethene dye, an acid dye, a direct dye, a basic dye, a mordant dye, an acid mordant dye, an azoic dye, a disperse dye, an oil-soluble dye, a food dye, or derivatives thereof.

19. The coloring composition according to claim 1, wherein the polymerizable compounds include a polymerizable compound represented by the following Formula (1a),

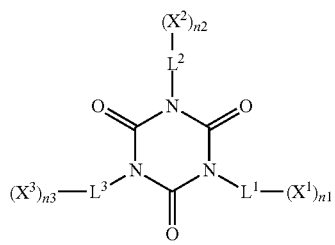

(1a)

wherein in Formula (1a), n1 and n2 each independently represent an integer of 1 or more, n3 represents an integer of 2 or more, $X^1$ to $X^3$ each independently represent a hydrogen atom or a polymerizable group, in which at least four of $X^1$, $X^2$, or $X^3$ represent a polymerizable group, in a case where plural $X^1$'s, $X^2$'s, or $X^3$'s are present, plural $X^1$'s, $X^2$'s, or $X^3$'s may be the same as or different from each other, and $L^1$ represents a (1+n1) valent linking group, $L^2$ represents a (1+n2) valent linking group, $L^3$ represents a (1+n3) valent linking group, and at least one of $L^1$, $L^2$, or $L^3$ represents a linking group including —$((CH_2)_a$—$O)_b$—, a represents an integer of 2 or more, and b represents an integer of 2 or more.

* * * * *